United States Patent
Nagasawa et al.

(10) Patent No.: US 9,587,137 B2
(45) Date of Patent: *Mar. 7, 2017

(54) CONDUCTIVE POLYMER COMPOSITE COMPRISING A SULFO GROUP-CONTAINING DOPANT POLYMER AND SUBSTRATE

(71) Applicant: SHIN-ETSU CHEMICAL CO., LTD., Tokyo (JP)

(72) Inventors: Takayuki Nagasawa, Jyoetsu (JP); Jun Hatakeyama, Jyoetsu (JP); Koji Hasegawa, Jyoetsu (JP)

(73) Assignee: SHI-ETSU CHEMICAL CO., LTD., Tokyo (JP)

( * ) Notice: Subject to any disclaimer, the term of this patent is extended or adjusted under 35 U.S.C. 154(b) by 22 days.

This patent is subject to a terminal disclaimer.

(21) Appl. No.: 14/717,323

(22) Filed: May 20, 2015

(65) Prior Publication Data

US 2015/0340118 A1 Nov. 26, 2015

(30) Foreign Application Priority Data

May 20, 2014 (JP) ................................ 2014-104653
Mar. 11, 2015 (JP) ................................ 2015-48728
Apr. 22, 2015 (JP) ................................ 2015-87778

(51) Int. Cl.

| | | |
|---|---|---|
| C09D 165/00 | (2006.01) | |
| H01B 1/12 | (2006.01) | |
| C09D 5/24 | (2006.01) | |
| C08J 5/18 | (2006.01) | |
| C08L 65/00 | (2006.01) | |
| C09D 179/02 | (2006.01) | |
| H01L 51/00 | (2006.01) | |

(Continued)

(52) U.S. Cl.

CPC ....... *C09D 165/00* (2013.01); *C08G 73/0266* (2013.01); *C08J 5/18* (2013.01); *C08L 41/00* (2013.01); *C08L 65/00* (2013.01); *C09D 5/24* (2013.01); *C09D 179/02* (2013.01); *H01B 1/125* (2013.01); *H01B 1/127* (2013.01); *H01B 1/128* (2013.01); *H01L 51/0037* (2013.01); *C08G 2261/1424* (2013.01); *C08G 2261/3223* (2013.01); *C08G 2261/44* (2013.01); *C08G 2261/512* (2013.01); *C08G 2261/794* (2013.01); *C08G 2261/90* (2013.01); *C08J 2341/00* (2013.01); *C08J 2441/00* (2013.01)

(58) Field of Classification Search

CPC ...... C09D 165/00; C09D 5/24; C09D 179/02; H01B 1/125; H01B 1/127; H01B 1/128; C08J 5/18; C08J 2341/00; C08J 2441/00; C08L 65/00; C08L 41/00; H01L 51/0037; C08G 73/0266; C08G 2261/1424; C08G 2261/44; C08G 2261/512; C08G 2261/794; C08G 2261/90; C08G 2261/3223

USPC ....................................................... 252/500

See application file for complete search history.

(56) References Cited

U.S. PATENT DOCUMENTS

| | | | |
|---|---|---|---|
| 9,017,924 B2 * | 4/2015 | Takaki | G03F 7/0388 430/270.1 |
| 2006/0047030 A1 * | 3/2006 | Yoshida | C08K 5/34 524/99 |
| 2007/0069185 A1 | 3/2007 | Hsu et al. | |

(Continued)

FOREIGN PATENT DOCUMENTS

| | | |
|---|---|---|
| JP | 2008-146913 A | 6/2008 |
| JP | 2008-546899 A | 12/2008 |

(Continued)

OTHER PUBLICATIONS

Oct. 26, 2015 Extended Search Report issued in European Patent Application No. 15001522.0.

(Continued)

*Primary Examiner* — Michael M Bernshteyn
(74) *Attorney, Agent, or Firm* — Oliff PLC

(57) ABSTRACT

A conductive polymer composite includes (A) a π-conjugated polymer and (B) a dopant polymer which contains a repeating unit "a" which is shown by the following general formula (1) having weight-average molecular weight thereof in the range of 1,000 to 500,000,

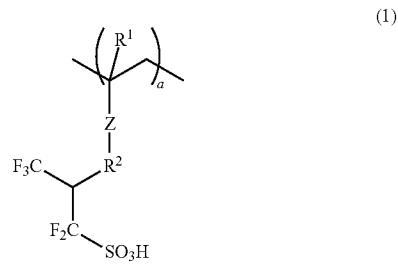

(1)

wherein, $R^1$ represents a hydrogen atom or a methyl group; $R^2$ represents a single bond, an ester group, or a linear, branched, or cyclic hydrocarbon group having 1 to 12 carbon atoms which may optionally contain any one of an ether group and an ester group or both; Z represents a phenylene group, a naphthylene group, or an ester group; and "a" is in the range of $0 < a \leq 1.0$. There can be provided a conductive polymer composite which has excellent filterability and film-formability by spin coating, and also can form a conductive film having high transparency and excellent flatness when the film is formed with the composite.

20 Claims, No Drawings

(51) Int. Cl.
*C08G 73/02* (2006.01)
*C08L 41/00* (2006.01)

(56) References Cited

U.S. PATENT DOCUMENTS

| | | | |
|---|---|---|---|
| 2008/0102407 A1 | 5/2008 | Ohsawa et al. | |
| 2010/0055608 A1* | 3/2010 | Ohashi | C07D 493/18 430/270.1 |
| 2012/0012795 A1* | 1/2012 | Hsu | C08L 65/00 252/500 |
| 2012/0082939 A1* | 4/2012 | Kawabata | C08F 220/38 430/319 |
| 2012/0129103 A1 | 5/2012 | Ohsawa et al. | |
| 2012/0202153 A1 | 8/2012 | Hatakeyama | |
| 2013/0224659 A1 | 8/2013 | Ohashi et al. | |
| 2013/0323647 A1 | 12/2013 | Ohashi et al. | |

FOREIGN PATENT DOCUMENTS

| | | |
|---|---|---|
| JP | 2013-228447 A | 11/2013 |
| WO | 2007/002682 A2 | 1/2007 |

OTHER PUBLICATIONS

Dec. 30, 2015 Office Action Issued in U.S. Appl. No. 14/564,167.
Mar. 16, 2016 Office Action Issued in U.S. Appl. No. 14/564,494.
Nov. 23, 2015 Office Action Issued in U.S. Appl. No. 14/564,494.
Apr. 21, 2016 Office Action issued in U.S. Appl. No. 14/564,167.
Sep. 2, 2016 Office Action Issued in U.S. Appl. No. 14/564,167.

* cited by examiner

CONDUCTIVE POLYMER COMPOSITE COMPRISING A SULFO GROUP-CONTAINING DOPANT POLYMER AND SUBSTRATE

BACKGROUND OF THE INVENTION

Field of the Invention

The present invention relates to a conductive polymer composite and a substrate having a conductive film formed thereon with the conductive polymer composite.

Description of the Related Art

A polymer having a conjugated double bond (i.e. π-conjugated polymer) does not show an conductivity by itself; however, if an appropriate anionic molecule is doped therein, it can express an conductivity thereby giving a conductive polymer material (i.e. conductive polymer composition). As to the π-conjugated polymer, (hetero) aromatic polymers such as polythiophene, polyselenophene, polytellurophene, polypyrrole, and polyaniline, and a mixture thereof are used; and as to the anionic molecule (dopant), an anion of a sulfonic acid type is most commonly use. This is because a sulfonic acid, which is a strong acid, can interact with these π-conjugated polymers efficiently.

As to the anionic dopant of the sulfonic acid type, sulfonic acid polymers such as polyvinyl sulfonic acid and polystyrene sulfonic acid (PSS) are widely used (Patent Document 1). The sulfonic acid polymer includes a vinyl perfluoroalkyl ether sulfonic acid represented by Nafion (registered trademark); and this is used for a fuel cell.

Polystyrene sulfonic acid (PSS), which is a homopolymer of a sulfonic acid, has a sulfonic acid in the polymer main chain successively as the monomer unit thereof, so that this has a high doping effect to the π-conjugated polymer; and in addition, water dispersibility of the π-conjugated polymer after being doped can be enhanced. This is because the hydrophilicity is kept due to the excessively present sulfo group in PSS, whereby the dispersibility into water can be enhanced dramatically.

The polythiophene having PSS as a dopant shows high conductivity and can be handled as an aqueous dispersion, so that this is expected as a material for a coating-type conductive film in place of ITO (indium-tin oxide). As mentioned above, PSS is a water-soluble resin, and thus, it is hardly soluble in an organic solvent. Accordingly, the polythiophene having PSS as a dopant has a high hydrophilicity, but it is low in affinity with an organic solvent and an organic substrate, so that it is difficult to disperse it into an organic solvent or to form a film onto an organic substrate.

Besides, for example, when the polythiophene having PSS as a dopant is used in a conductive film for an organic EL lighting, the above-mentioned polythiophene having PSS as a dopant has an extremely high hydrophilicity; and therefore, a large quantity of water tends to readily remain in the conductive film, and in addition, the conductive film thus formed tends to readily absorb humidity from an outside atmosphere. As a result of them, there are problems that the light emitting capability of the luminous body of the organic EL is deteriorated due to chemical change thereof and that water agglomerates to give a defect as the passage of time thereby leading to shortening of the useful life of the entirety of the organic EL device.

In addition, since the polythiophene having PSS as a dopant has an absorption in the visible light region, in the case that this material is used as a film coated onto a transparent substrate such as a transparent electrode, there is another problem that the transmittance of the film is affected if the conductivity need for the function of the device is made up by the solid concentration or by the film thickness.

In Patent Document 2, conductive polymer compositions are proposed which are formed by a π-conjugated polymer formed of a repeating unit selected from thiophene, pyrrole, aniline, and a polycyclic aromatic compound, and a conductive polymer including a fluorinated acid polymer which can be wetted by an organic solvent; and it is shown therein that an aqueous dispersion of the conductive polymer can be obtained by combining, in an arbitrary order, water, a precursor monomer of the π-conjugated polymer, the fluorinated acid polymer, and an oxidant.

However, in the above-mentioned conventional conductive polymers, particles are agglomerated in the dispersion immediately after the synthesis thereof; and in addition, if an organic solvent is added therein to make it a highly conductive material as the coating material, agglomeration thereof is further facilitated so that the filterability thereof deteriorates furthermore. If the coating material is coated by spin coating without filtration, a flat film cannot be obtained due to the effect of the particle agglomeration; and as a result of it, there is a problem that this causes poor coating.

PRIOR ART DOCUMENTS

Patent Documents

Patent Document 1: Japanese Patent Laid-Open Publication No. 2008-146913

Patent Document 2: Japanese Patent Laid-Open Publication No. 2008-546899

SUMMARY OF THE INVENTION

As mentioned above, the polythiophene-based conductive polymer having PSS as a dopant such as widely applicable PEDOT-PSS has poor transparency due to absorption in the visible light although it has a high conductivity; and in addition, purification thereof by filtration has been difficult because it has a strong agglomeration tendency in the state of the aqueous dispersion, and therefore, there have been problems that the film-formability by spin coating was poor and that the surface where the film is formed was rough.

The present invention was made in view of the situation as mentioned above; and therefore, the present invention has an object to provide a conductive polymer composite which has excellent filterability and film-formability by spin coating, and also can form a conductive film having high transparency and flatness when the film is formed with the composite.

In order to solve the problems as mentioned above, the present invention provides a conductive polymer composite comprising:

(A) a π-conjugated polymer and (B) a dopant polymer which contains a repeating unit "a" which is shown by the following general formula (1) having weight-average molecular weight thereof in the range of 1,000 to 500,000,

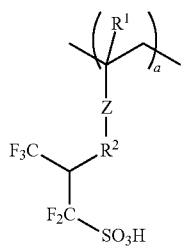
(1)

wherein, $R^1$ represents a hydrogen atom or a methyl group; $R^2$ represents a single bond, an ester group, or a a linear, branched, or cyclic hydrocarbon group having 1 to 12 carbon atoms which may optionally contain any one of an ether group and an ester group or both; Z represents a phenylene group, a naphthylene group, or an ester group; and "a" is in the range of $0 < a \le 1.0$.

The conductive polymer composite as mentioned above has excellent filterability and film-formability onto an inorganic substrate or an organic substrate by spin coating, and also can form a conductive film having high transparency and flatness when the film is formed with the composite.

In this case, it is preferable that the repeating unit "a" in the component (B) contain one or more repeating units selected from "a1" to "a6" which are shown by the following general formulae (1-1) to (1-6),

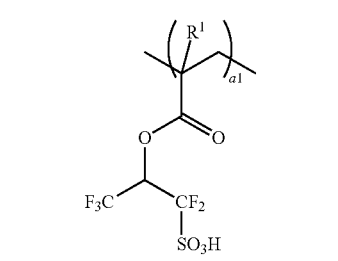
(1-1)

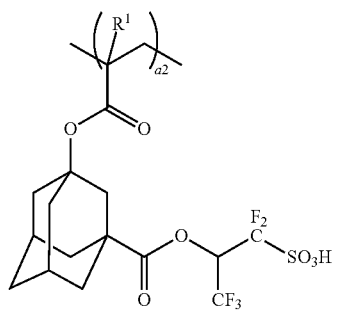
(1-2)

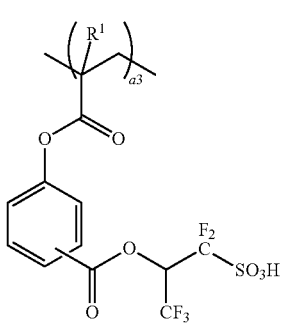
(1-3)

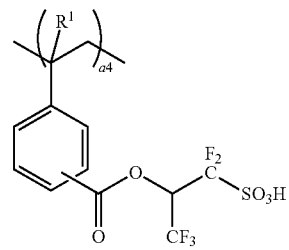
(1-4)

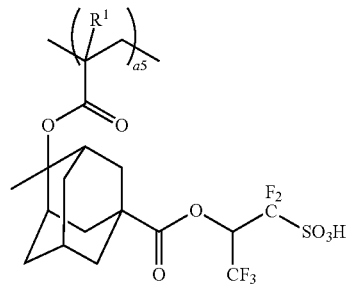
(1-5)

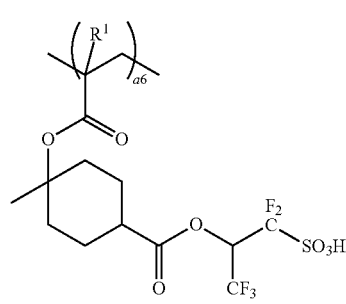
(1-6)

wherein, $R^1$ represents the same meaning as before; and "a1", "a2", "a3", "a4", "a5", and "a6" each are in the range of $0 \le a1 \le 1.0$, $0 \le a2 \le 1.0$, $0 \le a3 \le 1.0$, $0 \le a4 \le 1.0$, $0 \le a5 \le 1.0$, $0 \le a6 \le 1.0$, and also $0 < a1+a2+a3+a4+a5+a6 \le 1.0$.

By using the component (B) shown above, the composite can be improved in filterability, film-formability, affinity to an organic solvent and an organic substrate, and transparency after film formation.

In this case, it is preferable that the component (B) further contain a repeating unit "b" which is shown by the following general formula (2),

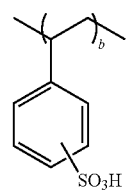
(2)

wherein, "b" is in the range of $0 < b < 1.0$.

By containing the above-mentioned repeating unit "b" therein, the conductivity of the composite can be enhanced furthermore.

In this case, the component (B) is preferably a block copolymer.

If the component (B) is a block copolymer, the conductivity of the composite can be enhanced furthermore.

In this case, the component (A) is preferably a polymer formed by polymerization of one or more precursor monomers selected from the group consisting of pyrrole, thiophene, selenophene, tellurophene, aniline, a polycyclic aromatic compound, and a derivative thereof.

When these monomers are used, polymerization thereof is easy, and in addition, stability thereof in an air is high; and thus, the component (A) can be synthesized readily.

In this case, it is preferable that the conductive polymer composite have dispersibility in water or in an organic solvent.

In addition, the present invention provides a substrate having a conductive film formed thereon with the above-mentioned conductive polymer composite.

Thus, the conductive polymer composite of the present invention can give a conductive film by applying it onto a substrate or the like to form a film thereon.

The conductive film thus formed has excellent conductivity and transparency, so that it can function as a transparent electrode layer.

As mentioned above, in the conductive polymer composite of the present invention, the dopant polymer of the component (B) which contains a super acidic sulfo group forms the composite together with the π-conjugated polymer of the component (A), so that this composite has low viscosity and good filterability as well as superior film-formability by spin coating; and therefore, a conductive film having excellent transparency, flatness, durability, and conductivity can be formed when the film is formed with the composite. In addition, the above-mentioned conductive polymer composite has excellent affinity to an organic solvent and an organic substrate; and furthermore, it has excellent film-formability onto both an organic substrate and an inorganic substrate.

In addition, the conductive film formed by the above-mentioned conductive polymer composite has excellent conductivity, transparency, and the like; and therefore, this film can function as a transparent electrode layer.

DETAILED DESCRIPTION OF THE PREFERRED EMBODIMENTS

As mentioned above, a material for forming a conductive film which has excellent filterability and film-formability by spin coating, and can form the film having high transparency and excellent flatness when the film is formed with the same has been wanted to be developed.

Inventors of the present invention carried out an extensive investigation; and as a result, it was found that by using a dopant polymer having a repeating unit which has an α-fluorinated sulfo group was used in place of polystyrene sulfonic acid (PSS) which had been widely used as a dopant of the conductive polymer material, the super acidic dopant polymer interacts strongly with the π-conjugated polymer thereby shifting the visible light absorption region of the π-conjugated polymer so that the transparency thereof could be enhanced. In addition, it was found that because the filterability could be improved, not only the film-formability by spin coating could be improved but also higher flatness of the film could be obtained at the timing of the film formation; and based on these findings, the present invention could be completed.

That is, the present invention is a conductive polymer composite comprising:

(A) a π-conjugated polymer and
(B) a dopant polymer which contains a repeating unit "a" which is shown by the following general formula (1) having weight-average molecular weight thereof in the range of 1,000 to 500,000,

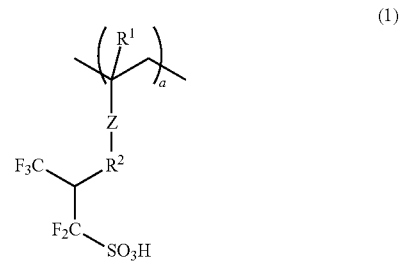

wherein, $R^1$ represents a hydrogen atom or a methyl group; $R^2$ represents a single bond, an ester group, or a linear, branched, or cyclic hydrocarbon group having 1 to 12 carbon atoms which may optionally contain any one of an ether group and an ester group or both; Z represents a phenylene group, a naphthylene group, or an ester group; and "a" is in the range of $0 < a \leq 1.0$.

Hereunder, the present invention will be explained in detail; however, the present invention will not be restricted thereto.

[(A) π-Conjugated Polymers]

The conductive polymer composite of the present invention contains a π-conjugated polymer as the component (A). This component (A) may be a polymer obtained by polymerization of a precursor monomer (i.e. organic monomer molecule) to form a π-conjugated chain which is a structure having a single bond and a double bond alternately and successively.

Illustrative example of the precursor monomer includes monocyclic aromatic compounds such as pyrroles, thiophenes, thiophene vinylenes, selenophenes, tellurophenes, phenylenes, phenylene vinylenes, and anilines; polycyclic aromatic compounds such as acenes; and acetylenes; and a homopolymer or a copolymer of these monomers can be used as the component (A).

Among these monomers, in view of easiness in polymerization and stability in an air, pyrrole, thiophene, selenophene, tellurophene, aniline, a polycyclic aromatic compound, and a derivative thereof are preferable. Particularly preferable are pyrrole, thiophene, aniline, and a derivative thereof, though not limited thereto.

The component (A) may have a sufficient conductivity even if the monomers which constitute the π-conjugated polymer is not substituted; however, in order to enhance the conductivity furthermore, monomers substituted with an alkyl group, a carboxy group, a sulfo group, an alkoxy group, a hydroxy group, a cyano group, a halogen atom, or the like may also be used.

Illustrative example of the monomers of pyrroles, thiophenes, and anilines includes pyrrole, N-methyl pyrrole, 3-methyl pyrrole, 3-ethyl pyrrole, 3-n-propyl pyrrole, 3-butyl pyrrole, 3-octyl pyrrole, 3-decyl pyrrole, 3-dodecyl pyrrole, 3,4-dimethyl pyrrole, 3,4-dibutyl pyrrole, 3-carboxy pyrrole, 3-methyl-4-carboxy pyrrole, 3-methyl-4-carboxyethyl pyrrole, 3-methyl 4-carboxybutyl pyrrole, 3-hydroxy pyrrole, 3-methoxy pyrrole, 3-ethoxy pyrrole, 3-butoxy pyrrole, 3-hexyloxy pyrrole, and 3-methyl-4-hexyloxy pyrrole; thiophene, 3-methyl thiophene, 3-ethyl thiophene, 3-propyl thiophene, 3-butyl thiophene, 3-hexyl thiophene, 3-heptyl thiophene, 3-octyl thiophene, 3-decyl thiophene, 3-dodecyl thiophene, 3-octadecyl thiophene, 3-bromo thiophene, 3-chloro thiophene, 3-iodo thiophene, 3-cyano thiophene, 3-phenyl thiophene, 3,4-dimethyl thiophene, 3,4-dibutyl thiophene, 3-hydroxy thiophene, 3-methoxy thiophene, 3-ethoxy thiophene, 3-butoxy thiophene, 3-hexyloxy thiophene, 3-heptyloxy thiophene, 3-octyloxy thiophene, 3-decyloxy thiophene, 3-dodecyloxy thiophene, 3-octadecyloxy thiophene, 3,4-dihydroxy thiophene, 3,4-dimethoxy thiophene, 3,4-diethoxy thiophene, 3,4-dipropoxy thiophene, 3,4-dibutoxy thiophene, 3,4-dihexyloxy thiophene, 3,4-diheptyloxy thiophene, 3,4-dioctyloxy thiophene, 3,4-didecyloxy thiophene, 3,4-didodecyloxy thiophene, 3,4-ethylenedioxy thiophene, 3,4-propylenedioxy thiophene, 3,4-butenedioxy thiophene, 3-methyl-4-methoxy thiophene, 3-methyl-4-ethoxy thiophene, 3-carboxy thiophene, 3-methyl-4-carboxy thiophene, 3-methyl-4-carboxyethyl thiophene, and 3-methyl-4-carboxybutyl thiophene; aniline, 2-methyl aniline, 3-isobutyl aniline, 2-methoxy aniline, 2-ethoxy aniline, 2-aniline sulfonic acid, and 3-aniline sulfonic acid.

Among them, a (co)polymer consisting of one or two compounds selected from pyrrole, thiophene, N-methyl pyrrole, 3-methyl thiophene, 3-methoxy thiophene, and 3,4-ethylenedioxy thiophene is preferably used in view of the resistance value and the reactivity thereof. Moreover, a homopolymer consisting of pyrrole or 3,4-ethylenedioxy thiophene has high conductivity; and therefore it is more preferable.

Meanwhile, for a practical reason, the repeat number of these repeating units (i.e. precursor monomers) in the component (A) is preferably in the range of 2 to 20, or more preferably in the range of 6 to 15.

In addition, the molecular weight of the component (A) is preferably in the range of about 130 to about 5,000.

[(B) Dopant Polymers]

The conductive polymer composite of the present invention contains a dopant polymer as the component (B). This dopant polymer of the component (B) is a super acidic polyanion having the repeating unit "a" shown by the following general formula (1) which contains a sulfonic acid whose α-position is fluorinated,

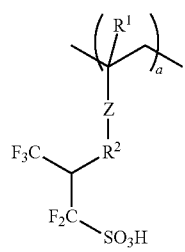

(1)

wherein, $R^1$ represents a hydrogen atom or a methyl group; $R^2$ represents a single bond, an ester group, or a linear, branched, or cyclic hydrocarbon group having 1 to 12 carbon atoms which may optionally contain any one of an ether group and an ester group or both; Z represents a phenylene group, a naphthylene group, or an ester group; and "a" is in the range of 0<a≤1.0.

In the general formula (1), $R^1$ represents a hydrogen atom or a methyl group.

$R^2$ represents a single bond, an ester group, or a linear, branched, or cyclic hydrocarbon group having 1 to 12 carbon atoms which may optionally contain any one of an ether group and an ester group or both. Illustrative example of the hydrocarbon group includes an alkylene group, an arylene group, and an alkenylene group.

Z represents a phenylene group, a naphthylene group, or an ester group.

"a" is in the range of 0<a≤1.0, or preferably in the range of 0.2≤a≤1.0.

The repeating unit "a" preferably contains one or more repeating units selected from "a1" to "a6" which are shown by the following general formulae (1-1) to (1-6),

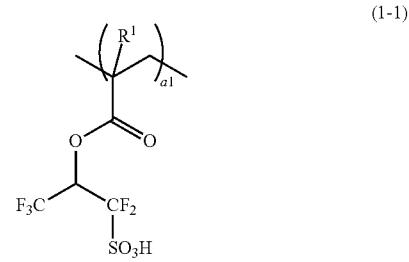

(1-1)

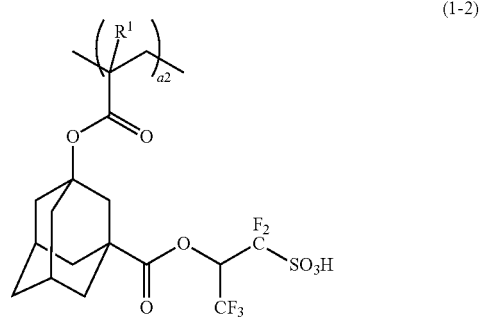

(1-2)

(1-3)

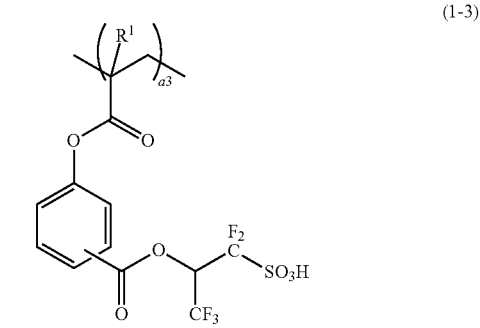

(1-4)

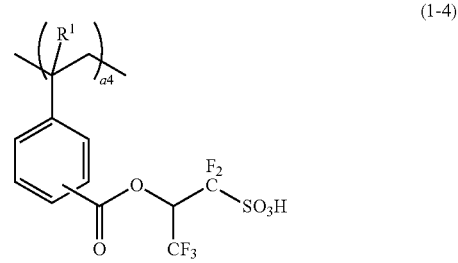

(1-5)

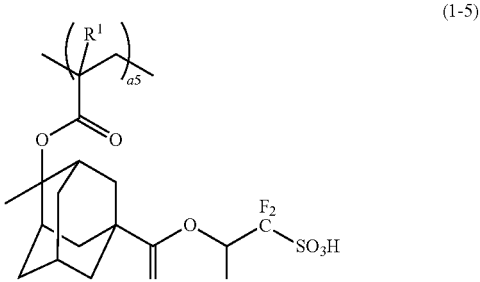

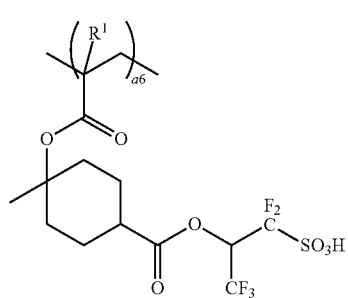

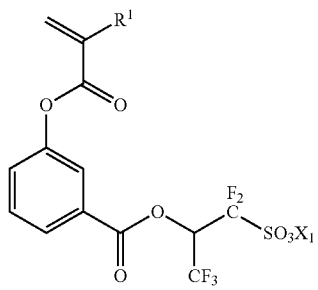

wherein, $R^1$ represents the same meaning as before; and "a1", "a2", "a3", "a4", "a5", and "a6" each are in the range of $0 \le a1 \le 1.0$, $0 \le a2 \le 1.0$, $0 \le a3 \le 1.0$, $0 \le a4 \le 1.0$, $0 \le a5 \le 1.0$, $0 \le a6 \le 1.0$, and also $0 < a1+a2+a3+a4+a5+a6 \le 1.0$.

Such a component (B) provides excellent filterability and film-formability by spin coating to the dispersion when the composite is formed with the component (A), and when a film is formed with the composite, a conductive film having high transparency and excellent flatness can be formed.

Illustrative example of the monomer giving the repeating unit "a" includes the following compounds,

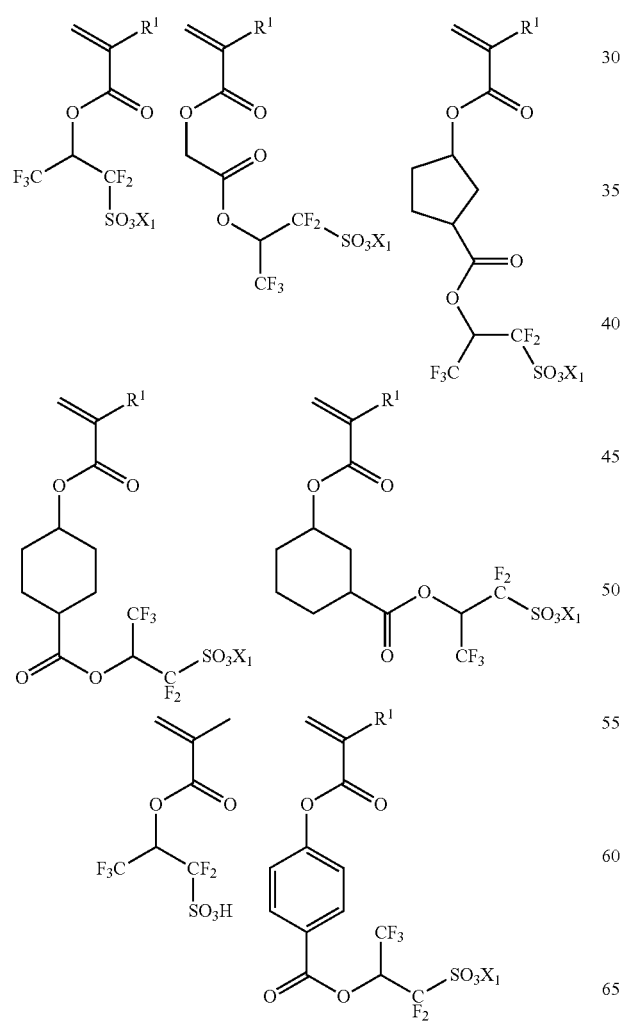

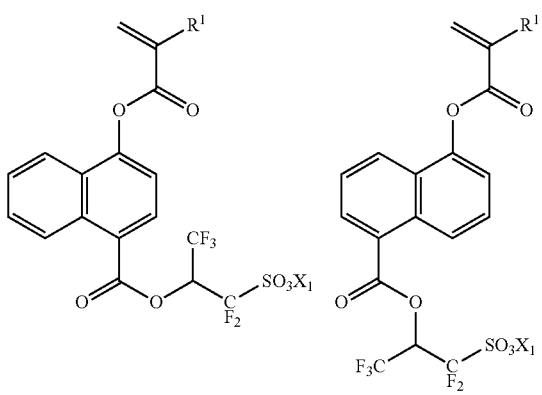

-continued
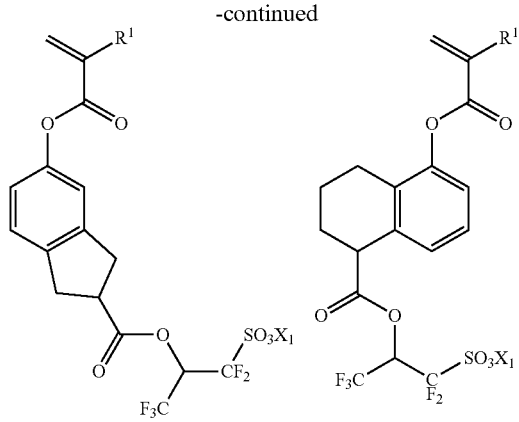
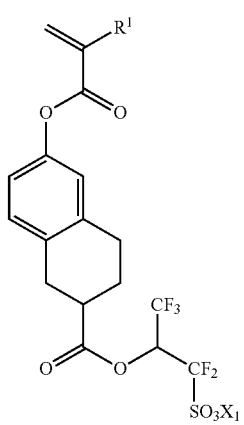
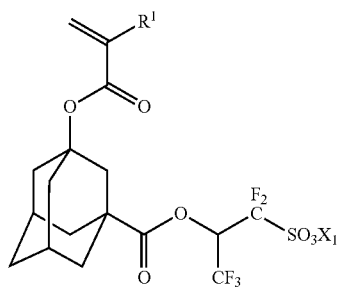
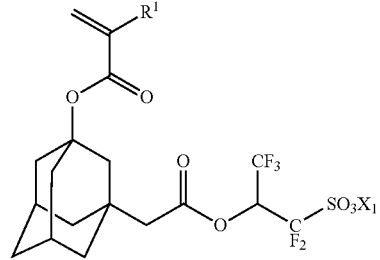
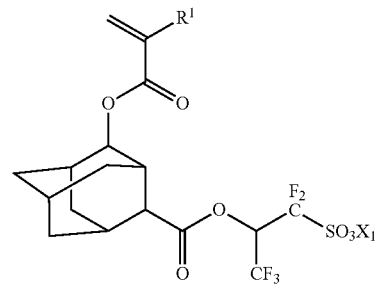
-continued
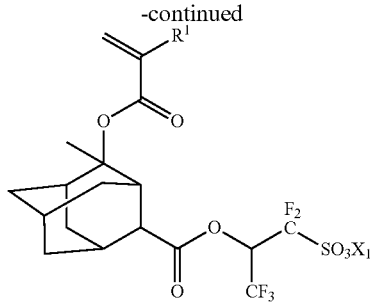
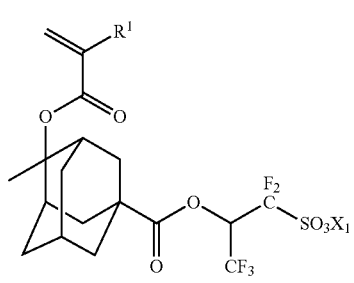
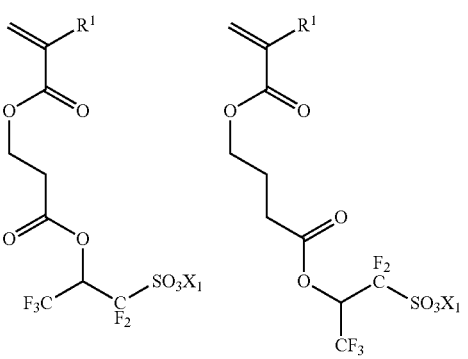
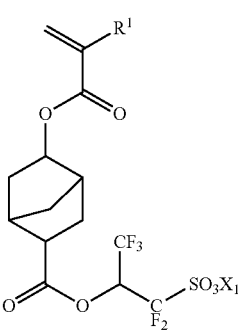
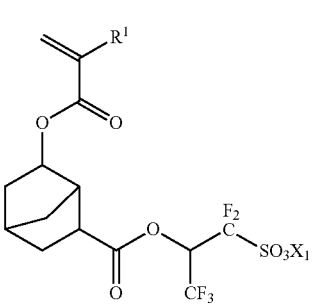
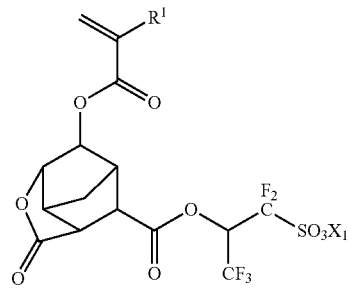

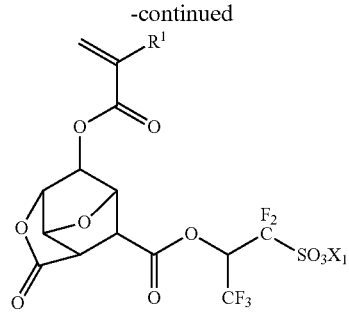
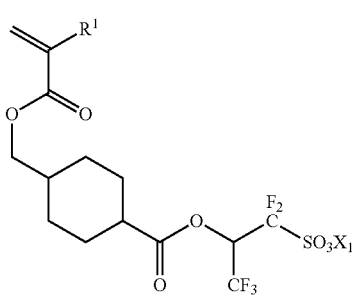
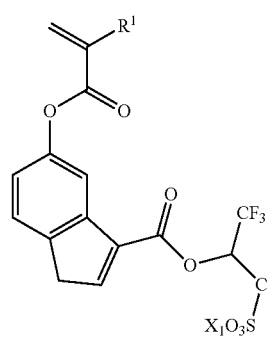
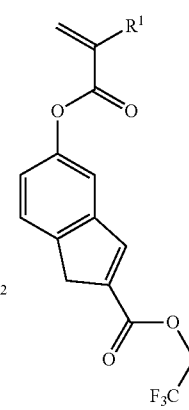
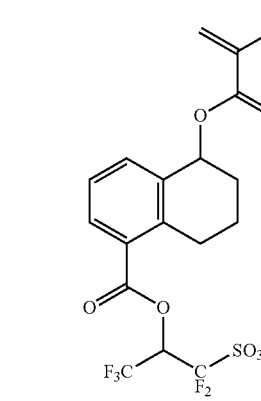
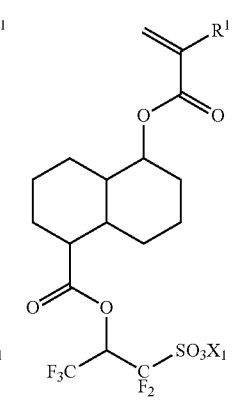
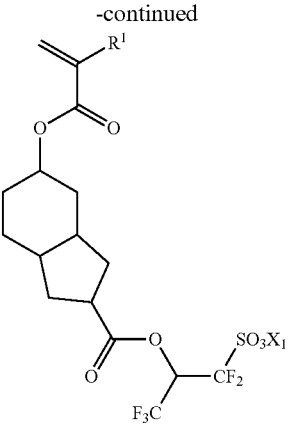
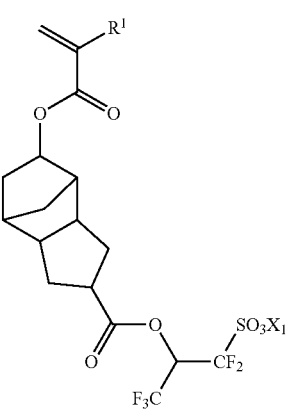
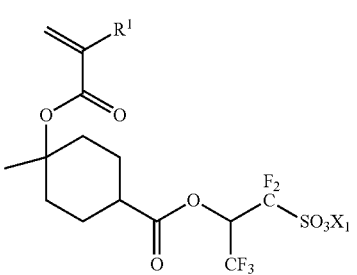
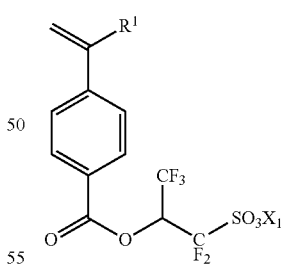
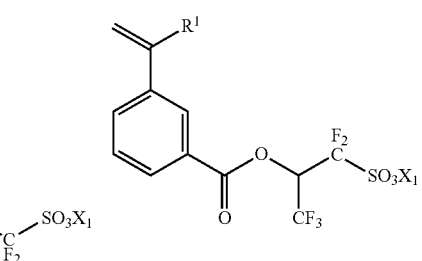
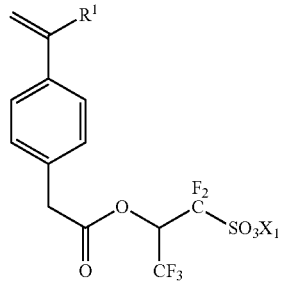

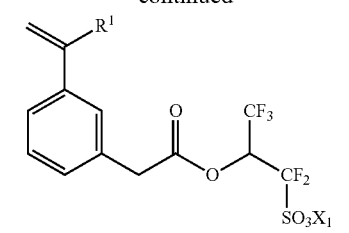

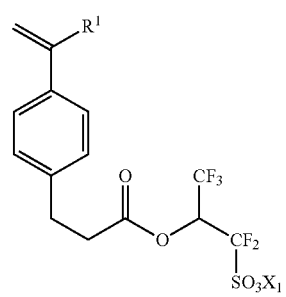

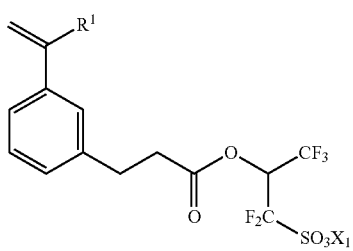

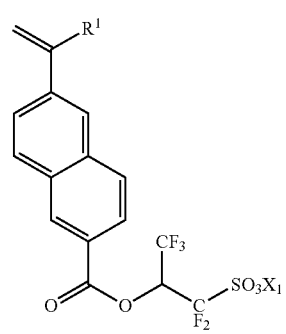

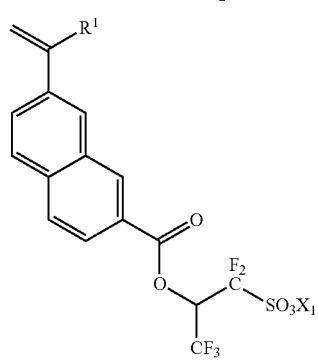

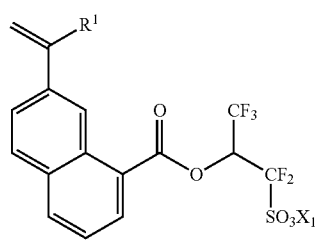

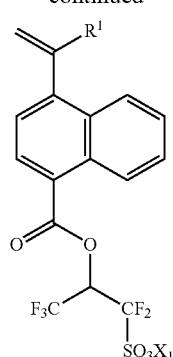

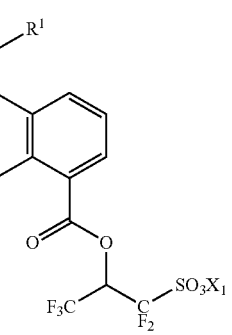

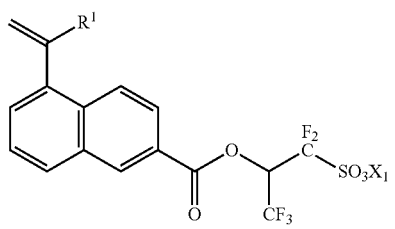

wherein, $R^1$ represents the same meaning as before; $X_1$ represents a hydrogen atom, a lithium atom, a sodium atom, a potassium atom, an amine compound, or a sulfonium compound.

It is preferable that the component (B) further contain the repeating unit "b" which is shown by the following general formula (2). When the repeating unit "b" is contained therein, the conductivity of the composite can be enhanced furthermore.

(2)

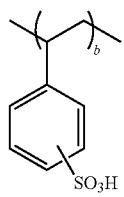

Illustrative example of the monomer giving the repeating unit "b" includes the following compounds,

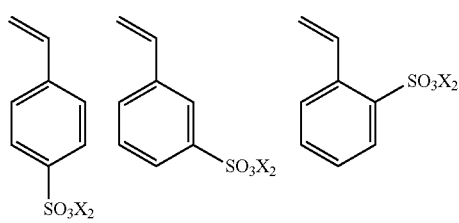

wherein, $X_2$ represents a hydrogen atom, a lithium atom, a sodium atom, a potassium atom, an amine compound, or a sulfonium compound.

If $X_1$ and/or $X_2$ are amine compounds, (P1a-3) which is described in the paragraph (0048) of Japanese Patent Laid-Open Publication No. 2013-228447 may be mentioned.

Here, as mentioned before, "a" is in the range of 0<a≤1.0, or preferably in the range of 0.2≤a≤1.0. If it is in the range of 0<a≤1.0 (namely, if the repeating unit "a" is contained therein), the effect of the present invention can be obtained; however, if it is in the range of 0.2≤a≤1.0, a higher effect thereof can be obtained.

Also, if the repeating unit "b" is contained therein, in view of enhancing the conductivity, "b" is preferably in the range of 0.3≤b<1.0, or more preferably in the range of 0.3≤b≤0.8.

In addition, the ratio of the repeating unit "a" and the repeating unit "b" is preferably in the range of 0.2≤a≤0.7 and 0.3≤b≤0.8, or more preferably in the range of 0.3≤a≤0.6 and 0.4≤b≤0.7.

In addition, the dopant polymer of the component (B) may contain a repeating unit "c" other than the repeating unit "a" and the repeating unit "b"; and illustrative example of this repeating unit "c" includes a styrene type, a vinyl naphthalene type, a vinyl silane type, acenaphthylene, indene, and vinyl carbazole.

Illustrative example of the monomer giving the repeating unit "c" includes the following compounds.

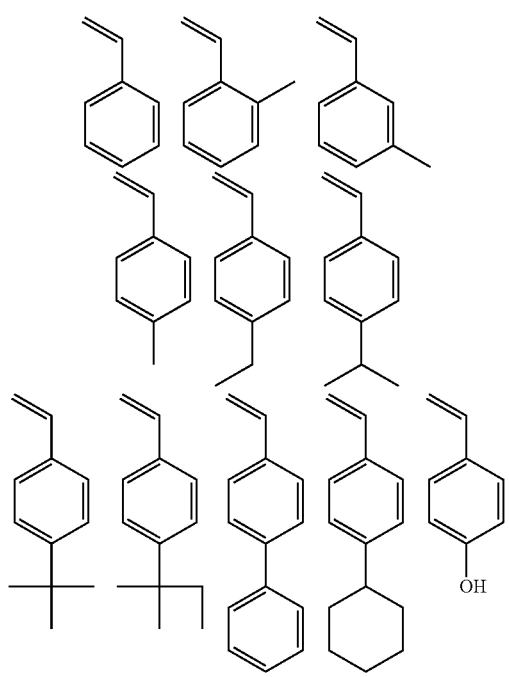

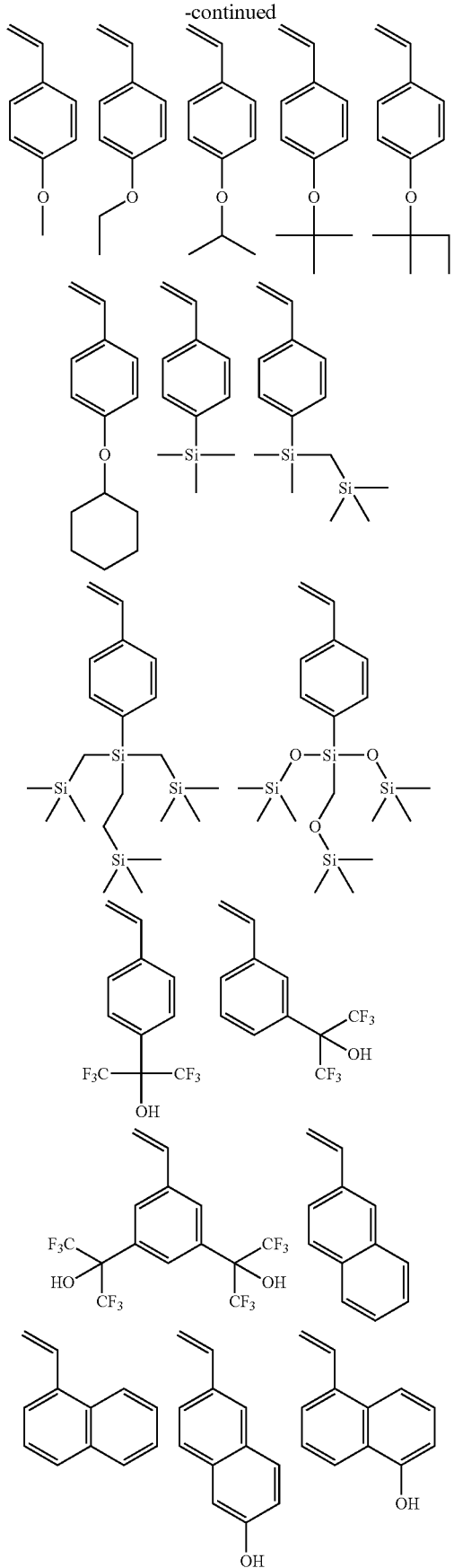

-continued
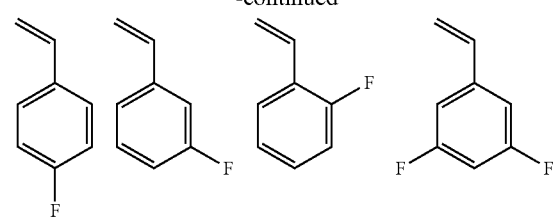
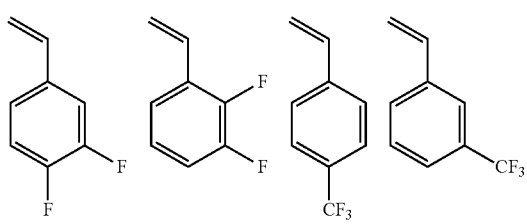
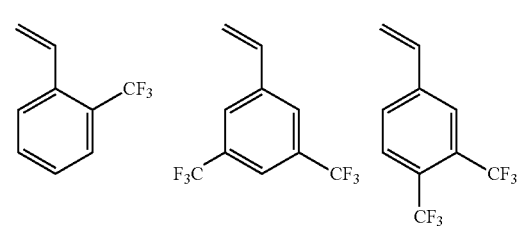
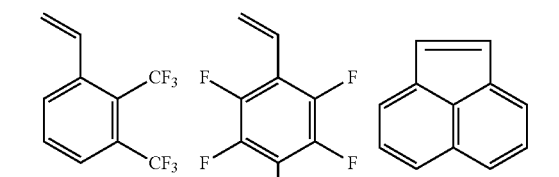
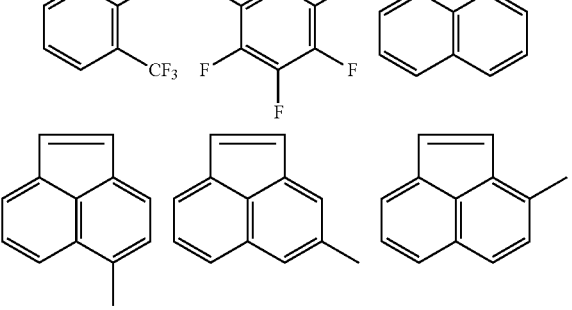
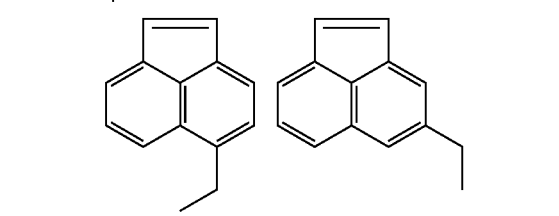
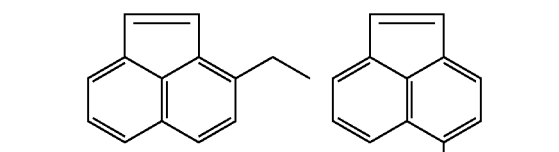
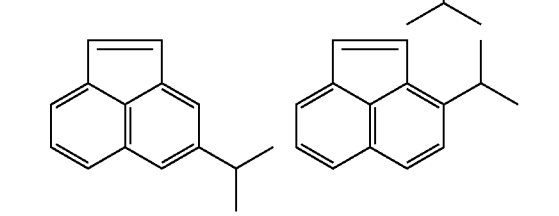
-continued
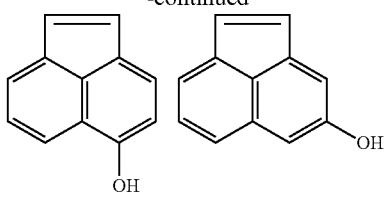
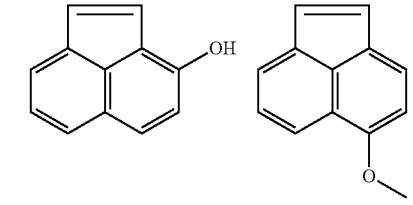
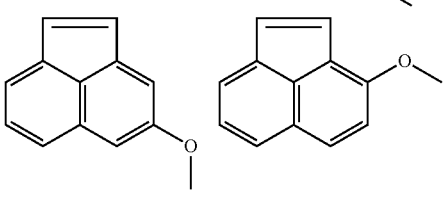
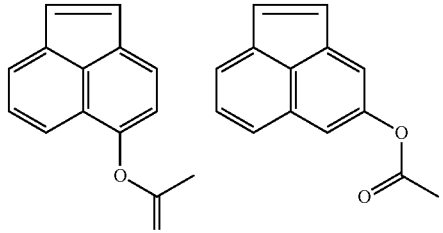
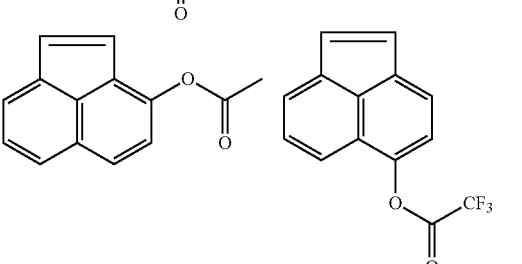
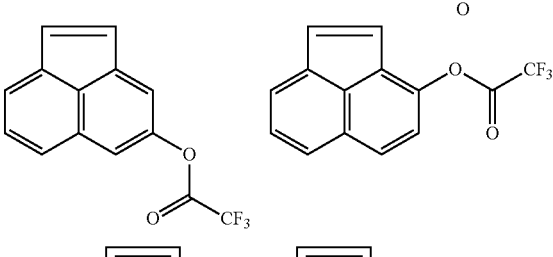
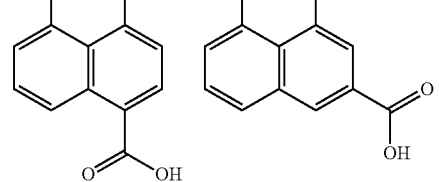
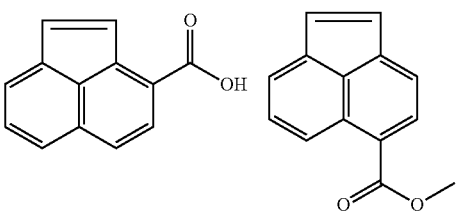

21
-continued
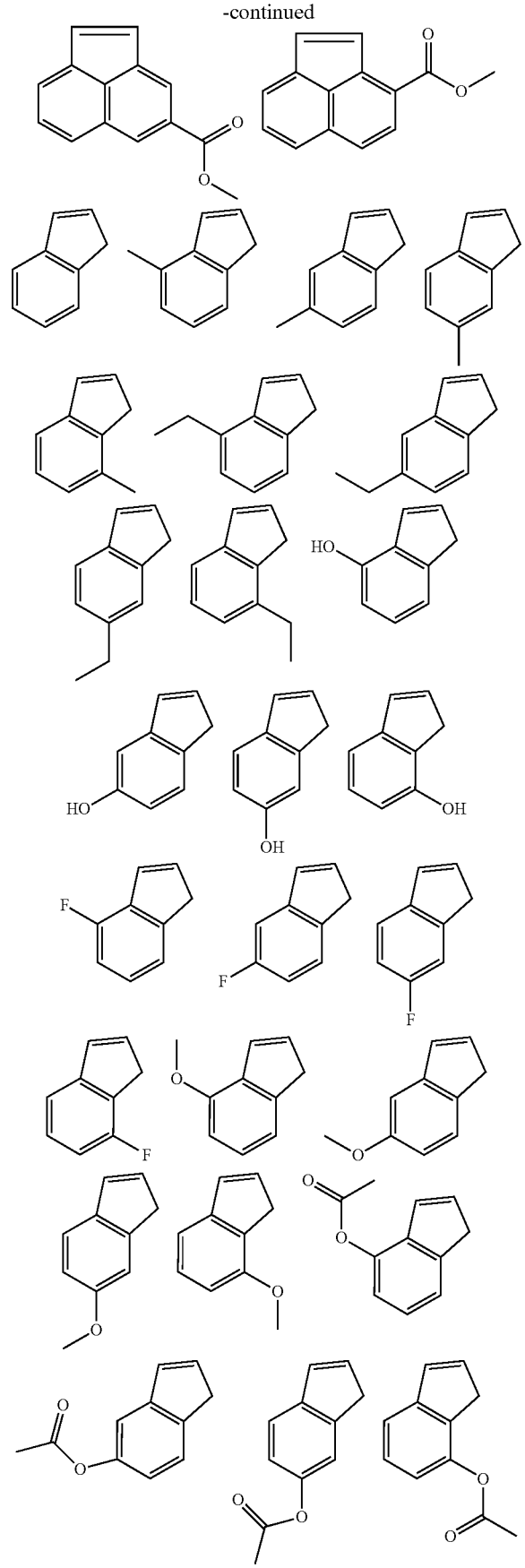
22
-continued
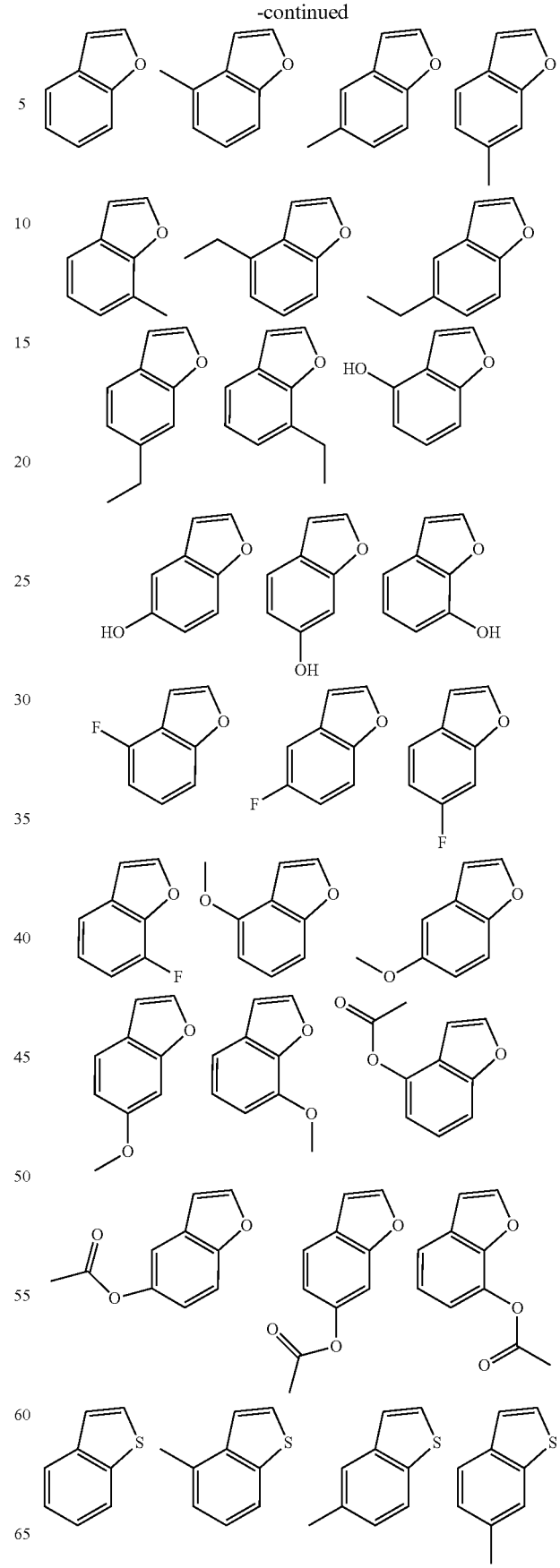

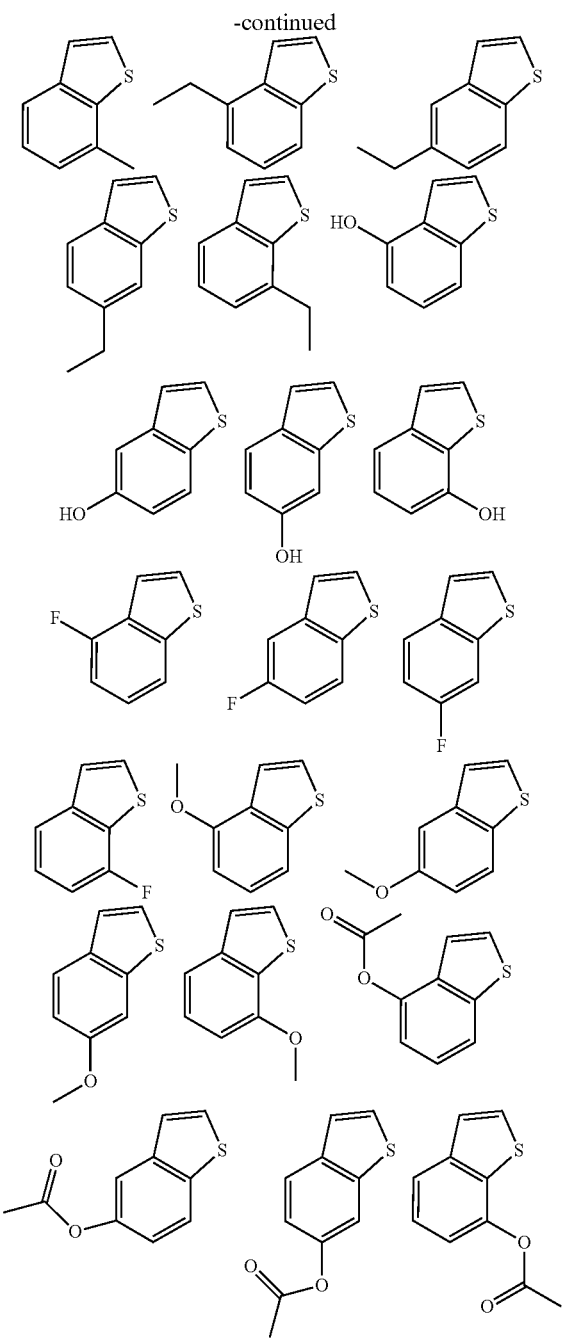

The dopant polymer of the component (B) may be synthesized, for example, by the following method. Namely, intended monomers giving the above-mentioned repeating units "a" to "c" are subjected to a thermal polymerization in the presence of a radical polymerization initiator in an organic solvent to obtain a (co)polymer of the dopant polymer.

Illustrative example of the organic solvent to be used during the polymerization includes toluene, benzene, tetrahydrofuran, diethyl ether, dioxane, cyclohexane, cyclopentane, methyl ethyl ketone, and γ-butyrolactone.

Illustrative example of the radical polymerization initiator includes 2,2'-azobisisobutyronitrile (AIBN), 2,2'-azobis(2,4-dimethylvaleronitrile), dimethyl 2,2'-azobis(2-methylpropionate), benzoyl peroxide, and lauroyl peroxide.

The reaction temperature is preferably in the range of 50 to 80° C.; and the reaction time is preferably in the range of 2 to 100 hours, or more preferably in the range of 5 to 20 hours.

In the dopant polymer of the component (B), the monomer giving the repeating unit "a" may be one kind or two or more kinds; however, a combination of monomers of a methacryl type and a styrene type with which a higher polymerizability can be obtained is preferable.

In the case that two or more of monomers giving the repeating unit "a" are used, the respective monomers may be copolymerized randomly or as a block. When a block copolymer is formed, the sea-island structure is formed by agglomeration among the repeating unit portions comprising two or more kinds of the repeating unit "a" with each other, whereby generating a special structure around the dopant polymer; and as a result of it, the merit to enhance the conductivity may be expected.

Each of the monomers giving the repeating units "a" to "c" may be copolymerized randomly or as a block. In this case, similarly to the case of the above-mentioned repeating unit "a", the merit to enhance the conductivity may be expected by making them to the block copolymer.

In the case that the random copolymerization is carried out by a radical polymerization, a generally used method is a thermal polymerization method in which monomers to be copolymerized and a radical polymerization initiator are mixed, and then it is followed by heating the resulting mixture. In the case that polymerization of a first monomer is initiated in the presence of a radical polymerization initiator and then followed by addition of a second monomer, the polymer in which one side of the polymer molecule has the structure of the first monomer polymerized and the other side thereof has the structure of the second monomer polymerized is obtained. However, in this case, at the middle portion thereof, the repeating units of the first monomer and the second monomer are mixedly, present; and therefore, this polymer has a morphology different from that of the block copolymer. In order to form the block copolymer by a radical polymerization method, a living radical polymerization method is preferably used.

In the living radical polymerization method called the RAFT polymerization (Reversible Addition Fragmentation chain Transfer polymerization), the radical at the polymer terminal is always alive; and therefore, by starting the polymerization with the first monomer, and then adding the second monomer thereto at the time when the first monomer has been consumed, it is possible to form a diblock copolymer comprising a block of the repeating unit of the first monomer and a block of the repeating unit of the second monomer. In addition, it is also possible to form a triblock copolymer, by starting the polymerization with the first monomer, then adding the second monomer thereto at the time when the first monomer has been consumed, and then adding the third monomer thereto.

The RAFT polymerization has the characteristic that the polymer having narrow molecular weight distribution (dispersity) can be obtained; and especially when the RAFT polymerization is carried out by adding the monomers all at once, the polymer having further narrower molecular weight distribution can be obtained.

Meanwhile, in the dopant polymer of the component (B), the molecular weight distribution (Mw/Mn) thereof is preferably in the range of 1.0 to 2.0, or especially preferably in the range of narrower dispersity of 1.0 to 1.5. If the dispersity thereof is narrow, lowering of the transmittance of the conductive film which is formed by the conductive polymer composite using this polymer can be prevented from occurring.

To carry out the RAFT polymerization, a chain transfer agent is necessary; and illustrative example thereof includes 2-cyano-2-propylbenzo thioate, 4-cyano-4-phenylcarbonothioyl thiopentanoic acid, 2-cyano-2-propyldodecyl trithiocarbonate, 4-cyano-4-[(dodecylsulfanylthiocarbonyl)sulfanyl]pentanoic acid, 2-(dodecylthiocarbonothioylthio)-2-methylpropanoic acid, cyanomethyl dodecylthiocarbonate, cyanomethyl methyl(phenyl)carbamothioate, bis(thiobenzoyl)disulfide, and bis(dodecylsulfanylthiocarbonyl)disulfide. Among them, 2-cyano-2-propylbenzo thioate is especially preferable.

The weight-average molecular weight of the dopant polymer of the component (B) is in the range of 1,000 to 500,000, or preferably in the range of 2,000 to 200,000. If the weight-average molecular weight thereof is less than 1,000, the heat resistance thereof is insufficient; and in addition, homogeneity of the composite solution with the component (A) becomes poor. On the other hand, if the weight-average molecular weight thereof is more than 500,000, not only the conductivity thereof deteriorates but also the viscosity thereof increases thereby deteriorating the workability and decreasing the dispersibility into water or into an organic solvent.

Meanwhile, the weight-average molecular weight thereof is measured by a gel permeation chromatography (GPC) by using water, dimethyl formamide (DMF), or tetrahydrofuran (THF) as the solvent for it; and this molecular weight is the measured value in terms of polyethylene oxide, polyethylene glycol, or polystyrene.

Meanwhile, as to the monomer to constitute the dopant polymer of the component (B), a monomer having a sulfo group may be used; however, a monomer having a lithium salt, a sodium salt, a potassium salt, an ammonium salt, or a sulfonium salt of a sulfo group may be used for the polymerization reaction, and after the polymerization, these salts may be converted into the sulfo group by an ion-exchange resin.

[Conductive Polymer Composite]

The conductive polymer composite of the present invention comprises the above-mentioned π-conjugated polymer of the component (A) and the above-mentioned dopant polymer of the component (B), in which the dopant polymer of the component (B) forms the composite by ion bonding with the π-conjugated polymer of the component (A).

It is preferable that the conductive polymer composite of the present invention have dispersibility in water or in an organic solvent; and if the conductive polymer composite has such a dispersibility, the film-formability by spin coating onto an inorganic substrate or an organic substrate (i.e. substrate having an inorganic film or an organic film formed on the surface thereof) as well as the flatness of the film can be made excellent.

(Method for Producing the Conductive Polymer Composite)

The composite of the component (A) and the component (B) may be obtained, for example, by the following way. That is, a raw material monomer of the component (A) (preferably pyrrole, thiophene, aniline, or a derivative monomer thereof) is added into an aqueous solution of the component (B) or into a water-organic solvent mixture solution of the component (B), which is then followed by addition of an oxidant or an oxidation catalyst, depending on the situation, to carry out the oxidative polymerization, whereby giving the composite.

Illustrative example of the oxidant and the oxidation catalyst includes peroxodisulfate salts (i.e. persulfate salts) such as ammonium peroxodisulfate (i.e. ammonium persulfate), sodium peroxodisulfate (i.e. sodium persulfate), and potassium peroxodisulfate (i.e. potassium persulfate); transition metal compounds such as ferric chloride, ferric sulfate, and cupric chloride; metal oxides such as silver oxide and cesium oxide; peroxides such as hydrogen peroxide and ozone; organic peroxides such as benzoyl peroxide; and oxygen.

As to the reaction solvent to be used for the oxidative polymerization, water or a mixed solvent of water with a solvent may be used. The solvent which can be used here is miscible with water and preferably dissolvable or dispersible the component (A) and the component (B). Illustrative example thereof includes polar solvents such as N-methyl-2-pyrrolidone, N,N'-dimethyl formamide, N,N'-dimethyl acetamide, dimethyl sulfoxide, and hexamethylene phosphortriamide; alcohols such as methanol, ethanol, propanol, and butanol; polyvalent aliphatic alcohols such as ethylene glycol, propylene glycol, dipropylene glycol, 1,3-butylene glycol, 1,4-butylene glycol, D-glucose, D-glucitol, isoprene glycol, butanediol, 1,5-pentanediol, 1,6-hexanediol, 1,9-nonanediol, and neopentyl glycol; carbonate compounds such as ethylene carbonate and propylene carbonate; cyclic ether compounds such as dioxane and tetrahydrofuran; linear ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; heterocyclic compounds such as 3-methyl-2-oxazolidinone; and nitrile compounds such as acetonitrile, glutaronitrile, methoxy acetonitrile, propionitrile, and benzonitrile. These solvents may be used singly or as a mixture of two or more of them. The blending amount of these water-miscible solvents is preferably 50% or less by mass with respect to entirety of the reaction solvents.

Besides the dopant polymer of the component (B), another anion capable of being doped into the π-conjugated polymer of the component (A) may be used. As to the anion like this, an organic acid is preferable in view of controlling the characteristic of de-doping from the π-conjugated polymer, and also in view of dispersibility, heat resistance, the environment resistance, and so force of the conductive polymer composite. As to the organic acid, an organic carboxylic acid, phenols, an organic sulfonic acid, and the like may be mentioned.

As to the organic carboxylic acid, the acids having one, or two or more carboxy groups in an aliphatic, an aromatic, an alicyclic compound, or the like may be used. Illustrative example thereof includes formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, and triphenylacetic acid.

Illustrative example of the phenols includes cresol, phenol, and xylenol.

As to the organic sulfonic acid, the acids having one, or two or more sulfo groups in an aliphatic, an aromatic, an alicyclic compound, or the like may be used. Illustrative example of the compound containing one sulfo group includes methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamide-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, butylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-amino-3-methylbenzene-1-sulfonic acid, 4-acetamide-3-chlorobenzenesulfonic acid, 4-chloro-3-nitrobenzenesulfonic acid, p-chlorobenzenesulfonic acid, naphthalenesuifonic acid, methylnaphthalenesulfonic acid, pentylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, polycondensation product of naphthalenesulfonic acid and formalin, and polycondensation product of melaminesulfonic acid and formalin.

Illustrative example of the compound containing two or more sulfo groups includes ethane disulfonic acid, butane disulfonic acid, pentane disulfonic acid, decane disulfonic acid, m-benzene disulfonic acid, o-benzene disulfonic acid, p-benzene disulfonic acid, toluene disulfonic acid, xylene disulfonic acid, chlorobenzene disulfonic acid, fluorobenzene disulfonic acid, aniline-2,4-disulfonic acid, aniline-2,5-disulfonic acid, dimethylbenzene disulfonic acid, diethylbenzene disulfonic acid, dibutylbenzene disulfonic acid, naphthalene disulfonic acid, methylnaphthalene disulfonic acid, ethylnaphthalene disulfonic acid, dodecylnaphthalene disulfonic acid, pentadecylnaphthalene disulfonic acid, butylnaphthalene disulfonic acid, 2-amino-1,4-benzene disulfonic acid, 1-amino-3,8-naphthalene disulfonic acid, 3-amino-1,5-naphthalene disulfonic acid, 8-amino-1-naphthol-3,6-disulfonic acid, 4-amino-5-naphthol-2,7-disulfonic acid, anthracene disulfonic acid, butylanthracene disulfonic acid, 4-acetamide-4'-isothio-cyanatostilbene-2,2'-disulfonic acid, 4-acetamide-4'-isothio-cyanatostilbene-2,2'-disulfonic acid, 4-acetamide-4'-maleimidylstilbene-2,2'-disulfonic acid, 1-acetoxypyrene-3,6,8-trisulfonic acid, 7-amino-1,3,6-naphthalene trisulfonic acid, 8-aminonaphthalene-1,3,6-trisulfonic acid, and 3-amino-1,5,7-naphthalene trisulfonic acid.

These anions other than the component (B) may be added, before polymerization of the component (A), into a solution containing a raw material monomer of the component (A), the component (B), an oxidant and/or an oxidative polymerization catalyst; or alternatively, into the conductive polymer composite (solution) which contains the component (A) and the component (B) after the polymerization.

The composite thus obtained, comprising the component (A) and the component (B), may be used after being pulverized by a homogenizer, a ball mill, or the like, if necessary.

For pulverization, a mixer/disperser which can apply a high shear force is preferably used. Illustrative example of the mixer/disperser includes a homogenizer, a high-pressure homogenizer, and a bead mill; among them, a high-pressure homogenizer is particularly preferable.

Illustrative example of the high-pressure homogenizer includes NanoVater (manufactured by Yoshida Kikai Co., Ltd.), Microfluidizer (manufactured by Powrex Corp.), and Ultimizer (manufactured by Sugino Machine Ltd.).

Illustrative example of the dispersion treatment by using the high-pressure homogenizer includes the treatment in which the composite solutions before the dispersion treatment are collided from the opposite direction with each other with a high pressure and the treatment in which this solution is passed through an orifice or a slit with a high pressure.

Before or after the pulverization, impurities may be removed by the measures such as filtration, ultrafiltration, and dialysis; and also, purification may be done by using a cationic ion-exchange resin, an anionic ion-exchange resin, a chelate resin, or the like.

Meanwhile, the total content of the component (A) and the component (B) in the conductive polymer composite solution is preferably in the range of 0.05 to 5.0% by mass. If the total content of the component (A) and the component (B) is 0.05% by mass or more, sufficient conductivity can be obtained; and if this total content is 5.0% by mass or less, the uniform conductive coat film can be obtained readily.

The content of the component (B) is preferably such an amount that the sulfo group in the component (B) is in the range of 0.1 to 10 mol, or more preferably in the range of 1 to 7 mol, per 1 mol of the component (A). If the content of the sulfa group in the component (B) is 0.1 mol or more, the doping effect to the component (A) is so high that sufficient conductivity can be secured. On the other hand, if the content of the sulfo group in the component (B) is 10 mol or less, the content of the component (A) also becomes appropriate, so that sufficient conductivity can be obtained.

Illustrative example of the organic solvent that can be added to the polymerization reaction aqueous solution or can dilute the monomers includes alcohols such as methanol, ethanol, propanol, and butanol, polyvalent aliphatic alcohols such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, 1,9-nonanediol, 1,3,5-adamantanetriol, 1,2,3-butanetriol, 1,2,4-butanetriol, 1,2,3-cyclohexanetriol, 1,3,5-cyclohexanetriol, and neopentyl glycol, chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, polypropylene glycol dialkyl ether, cyclic ether compounds such as dioxane and tetrahydrofuran, polar solvents such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, N-methyl-2-pyrrolidone, N,N'-dimethylformamide, N,N'-dimethyl acetamide, dimethyl sulfoxide, and hexamethylene phosphortriamide, carbonate compounds such as ethylene carbonate and propylene carbonate, heterocyclic compounds such as 3-methyl-2-oxazolidinone, nitrile compounds such as acetonitrile, glutaronitrile, methoxy acetonitrile, propionitrile, and benzonitrile, and a mixture of them.

Meanwhile, the use amount of the organic solvent is preferably in the range of 0 to 1,000 mL, especially preferably in the range of 0 to 500 mL, per 1 mol of the monomer. If the amount of the organic solvent is 1,000 mL or less, it is economical because the reaction vessel may not become too large.

[Other Components]
(Surfactant)

In the present invention, in order to enhance the wetting property to a body to be processed such as the substrate, a surfactant may be added therein. As to the surfactant like this, various surfactants of a nonionic, a cationic, and an anionic type may be mentioned. Illustrative example thereof includes nonionic surfactants such as a polyoxyethylene alkyl ether, a polyoxyethylene alkyl phenyl ether, a polyoxyethylene carboxylate, a sorbitan ester, and polyoxyethylene sorbitan ester; cationic surfactants such as an alkyltrimethylammonium chloride and an alkylbenzylammonium chloride; anionic surfactants such as an alkyl or an alkyl allyl sulfate salt, an alkyl or an alkyl allyl sulfonate salt, and a dialkyl sulfosuccinate salt; and amphoteric surfactants such as an amino acid type and a betaine type.

(Conductivity Enhancer)

In the present invention, in order to enhance the conductivity and to improve applicability and film-formability to a substrate or the like of the conductive polymer composite, an organic solvent other than the main solvent may be added. Illustrative example thereof includes alcohols such as methanol, ethanol, propanol, and butanol, polyvalent aliphatic alcohols such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, 1,9-nonanediol, 1,3,5-adamantanetriol, 1,2,3-butanetriol, 1,2,4-butanetriol, 1,2,3-cyclohexanetriol, 1,3,5-cyclohexanetriol, neopentyl glycol, and polyethylene glycol, chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether, cyclic ether compounds such as dioxane and tetrahydrofuran, polar solvents such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, N-methyl-2-pyrrolidone, N,N'-dimethylformamide, dimethyl sulfoxide, N,N'-dimethyl acetamide, sulfolane, and hexamethylene phosphortriamide, carbonate compounds such as ethylene carbonate and propylene carbonate, heterocyclic compounds such as 3-methyl-2-oxazolidinone, nitrile compounds such as acetonitrile, glutaronitrile, methoxy acetonitrile, propionitrile, and benzonitrile, and a mixture of them. The addition amount thereof is in the range of 1.0 to 50.0% by mass, or especially preferably in the range of 3.0 to 40.0% by mass. These solvents may be added before or after the polymerization of the conductive polymer composite.

As explained above, the conductive polymer composite of the present invention has excellent filterability and film-formability by spin coating, and also can form a conductive film having a high transparency and a low surface roughness.

[Conductive Film]

The conductive polymer composite (solution) obtained by the way as mentioned above can form a conductive film by coating it to a body to be processed such as a substrate. Illustrative example of the coating method of the conductive polymer composite (solution) includes coating by a spin coater and so forth, and by a bar coater, soaking, comma coating, spray coating, roll coating, screen printing, flexographic printing, gravure printing, and ink jet printing. After coating, heat-treatment by using a hot-air circulating furnace, a hot plate, or the like, or irradiation with IR light, UV light, or the like is carried out, so that the conductive film can be formed.

As discussed above, the conductive polymer composite of the present invention can form the conductive film by applying it onto a substrate or the like. In addition, the conductive film thus formed can be made to function as the transparent electrode layer, because it has excellent conductivity and transparency.

[Substrate]

In addition, the present invention provides a substrate having the conductive film formed thereon with the above-mentioned conductive polymer composite of the present invention.

Illustrative example of the substrate includes a glass substrate; a quartz substrate; a photomask blank substrate; a resin substrate; compound semiconductor wafers such as a silicon wafer, a gallium arsenic wafer, and an indium phosphorous wafer; and a flexible substrate. In addition, this may also be used as the anti-static top coat by applying it to a photoresist film.

As mentioned above, in the conductive polymer composite of the present invention, the dopant polymer of the component (B) which contains a super acidic sulfa group forms the composite together with the π-conjugated polymer of the component (A), so that this composite has low viscosity and good filterability as well as superior film-formability by spin coating; and therefore, a conductive film having excellent transparency, flatness, durability, and conductivity can be formed when the film is formed with the composite. In addition, the above-mentioned conductive polymer composite has excellent affinity to an organic solvent and an organic substrate; and furthermore, it has excellent film-formability onto both an organic substrate and an inorganic substrate.

In addition, the conductive film formed by the above-mentioned conductive polymer composite has excellent conductivity, transparency, and the like; and therefore, this film can function as a transparent electrode layer.

EXAMPLE

Hereunder, the present invention will be specifically explained by using Synthesis Examples, Preparation Examples, Comparative Preparation Examples, Examples, and Comparative Examples; however, the present invention is not limited thereto.

The monomers used in Synthesis Examples are shown below.

Monomer 1

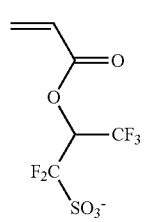

Monomer 2

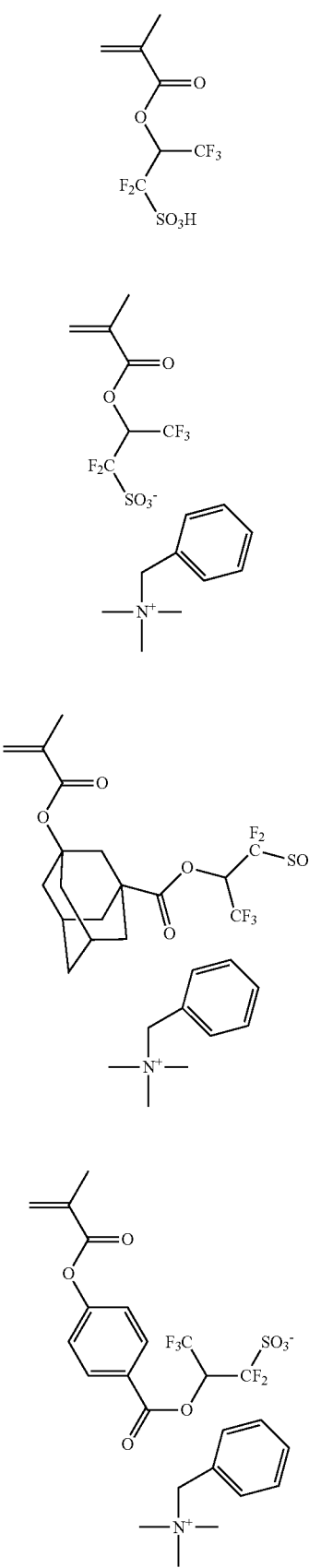

Monomer 5

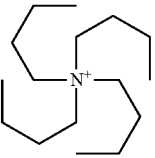

Monomer 6

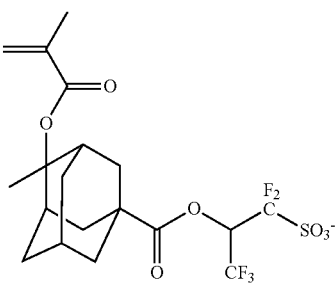

Monomer 3

Monomer 7

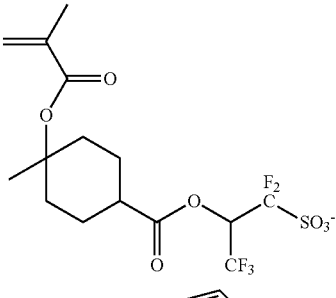

Monomer 4

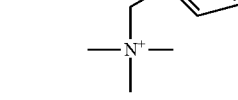

Monomer 1: 1,1,3,3,3-pentafluoro-2-(methacryloyloxy)propane-1-sulfonic acid
Monomer 2: benzyltrimethylammonium 1,1,3,3,3-pentafluoro-2-(methacryloyloxy)propane-1-sulfonate
Monomer 3: benzyltrimethylammonium 1,1,3,3,3-pentafluoro-2-(3-methacryloyloxy-adamantane-1-carbonyloxy)-propane-1-sulfonate
Monomer 4: benzyltrimethylammonium 1,1,3,3,3-pentafluoro-2-(3-methacryloyloxy-benzene-4-carbonyloxy)-propane-1-sulfonate
Monomer 5: tetrabutylammonium 1,1,1,3,3,3-pentafluoro-2-(acryloyloxy)propane-1-sulfonate
Monomer 6: benzyltrimethylammonium 1,1,3,3,3-pentafluoro-2-(4-methacryloyloxy-4-methyladamantane-1-carbonyloxy)-propane-1-sulfonate Monomer 7: benzyltrimethylammonium 1,1,3,3,3-pentafluoro-2-(4-acryloyloxy-4-methylcyclohexane-1-carbonyloxy)-propane-1-sulfonate Syntheses of Dopant Polymers Synthesis Example 1

Under the nitrogen atmosphere, into 37.5 g of methanol stirred at 64° C. was added gradually over 4 hours a solution in which 30.9 g of Monomer 1, 19.1 g of styrenesulfonic acid, and 4.77 g of dimethyl 2,2'-azobis(iso-butyrate) had been dissolved in 112.5 g of methanol. The resulting mixture was further stirred at 64° C. for 4 hours. After this mixture was cooled to room temperature, the mixture was gradually added into 1,000 g of ethyl acetate with vigorous stirring. The formed solid substance was collected by filtration, and then, it was dried under vacuum at 50° C. for 15 hours to obtain 42.5 g of white polymer.

Measurements of $^{19}$F-NMR, $^1$H-NMR, and GPC of the obtained polymer gave the following analysis results.

Copolymer composition ratio (molar ratio): Monomer 1:styrenesulfonic acid=1:1

Weight-average molecular weight (Mw): 29,900

Molecular weight distribution (Mw/Mn): 1.91

This polymer compound is designated as Dopant Polymer 1.

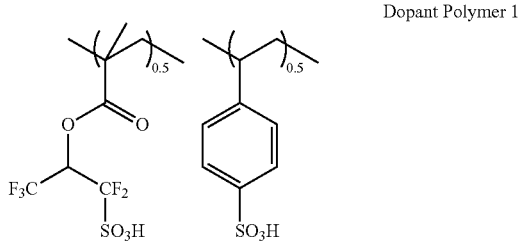

Dopant Polymer 1

Synthesis Example 2

Under the nitrogen atmosphere, into 37.5 g of methanol stirred at 64° C. was added gradually over 4 hours a solution in which 38.3 g of Monomer 3, 11.7 g of lithium styrenesulfonate, and 2.82 g of dimethyl 2,2'-azobis(iso-butyrate) had been dissolved in 112.5 g of methanol. The resulting mixture was further stirred at 64° C. for 4 hours. After this mixture was cooled to room temperature, the mixture was gradually added into 1,000 g of ethyl acetate with vigorous stirring. The formed solid substance was collected by filtration, and then, it was dried under vacuum at 50° C. for 15 hours to obtain 46.8 g of white polymer.

The obtained white polymer was dissolved into 421 g of methanol; and then, the ammonium and lithium salts thereof were converted into the sulfo group by using an ion-exchange resin. Measurements of $^{19}$F-NMR, $^1$H-NMR, and GPC of the polymer thus obtained gave the following analysis results.

Copolymer composition ratio (molar ratio): Monomer 3:styrenesulfonic acid=1:1

Weight-average molecular weight (Mw): 43,000

Molecular weight distribution (Mw/Mn): 1.77

This polymer compound is designated as Dopant Polymer 2.

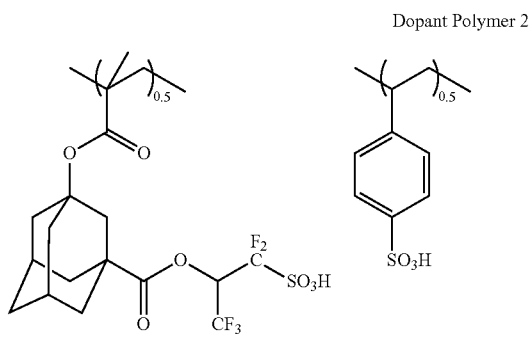

Dopant Polymer 2

Synthesis Example 3

Under the nitrogen atmosphere, into 37.5 g of methanol stirred at 64° C. was added gradually over 4 hours a solution in which 37.5 g of Monomer 4, 12.5 g of lithium styrenesulfonate, and 3.04 g of dimethyl 2,2'-azobis(iso-butyrate) had been dissolved in 112.5 g of methanol. The resulting mixture was further stirred at 64° C. for 4 hours. After this mixture was cooled to room temperature, the mixture was gradually added into 1,000 g of ethyl acetate with vigorous stirring. The formed solid substance was collected by filtration, and then, it was dried under vacuum at 50° C. for 15 hours to obtain 47.1 g of white polymer.

The obtained white polymer was dissolved into 424 g of methanol; and then, the ammonium and lithium salts thereof were converted into the sulfo group by using an ion-exchange resin. Measurements of $^{19}$F-NMR, $^1$H-NMR, and GPC of the polymer thus obtained gave the following analysis results.

Copolymer composition ratio (molar ratio): Monomer 4:styrenesulfonic acid=1:1

Weight-average molecular weight (Mw): 39,000

Molecular weight distribution (Mw/Mn): 1.81

This polymer compound is designated as Dopant Polymer 3.

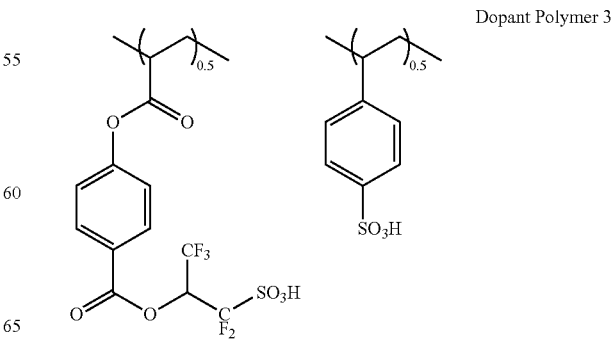

Dopant Polymer 3

Synthesis Example 4

Under the nitrogen atmosphere, into 37.5 g of methanol stirred at 64° C. was added gradually over 4 hours a solution in which 54.5 g of Monomer 4 and 4.19 g of dimethyl 2,2'-azobis(iso-butyrate) had been dissolved in 112.5 g of methanol. The resulting mixture was further stirred at 64° C. for 4 hours. After this mixture was cooled to room temperature, the mixture was gradually added into 1,000 g of ethyl acetate with vigorous stirring. The formed solid substance was collected by filtration, and then, it was dried under vacuum at 50° C. for 15 hours to obtain 43.6 g of white polymer.

The obtained white polymer was dissolved into 396 g of methanol; and then, the ammonium salt thereof was converted into the sulfo group by using an ion-exchange resin. Measurements of $^{19}$F-NMR, $^1$H-NMR, and GPC of the polymer thus obtained gave the following analysis results.

Weight-average molecular weight (Mw): 24,400
Molecular weight distribution (Mw/Mn): 1.94

This polymer compound is designated as Dopant Polymer 4.

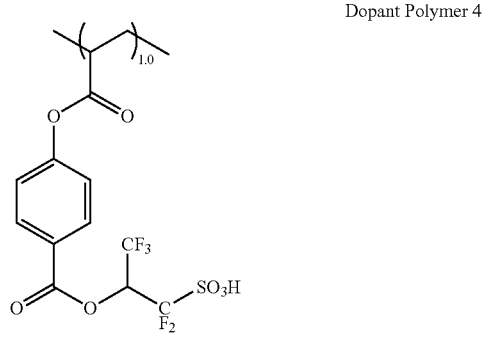

Dopant Polymer 4

Synthesis Example 5

Under the nitrogen atmosphere, into 37.5 g of methanol stirred at 64° C. was added gradually over 4 hours a solution in which 20.4 g of Monomer 2, 17.3 g of lithium styrenesulfonate, 12.3 g of 4-(1,1,1,3,3,3-hexafluoro-2-propanol) styrene, and 4.19 g of dimethyl 2,2'-azobis(iso-butyrate) had been dissolved in 112.5 g of methanol. The resulting mixture was further stirred at 64° C. for 4 hours. After this mixture was cooled to room temperature, the mixture was gradually added into 1,000 g of ethyl acetate with vigorous stirring. The formed solid substance was collected by filtration, and then, it was dried under vacuum at 50° C. for 15 hours to obtain 44.0 g of white polymer.

The obtained white polymer was dissolved into 396 g of methanol; and then, the ammonium and lithium salts thereof were converted into the sulfo group by using an ion-exchange resin. Measurements of $^{19}$F-NMR, $^1$H-NMR, and GPC of the polymer thus obtained gave the following analysis results.

Copolymer composition ratio (molar ratio): Monomer 2:styrenesulfonic acid:4-(1,1,1,3,3,3-hexafluoro-2-propanol)styrene=1:2:1

Weight-average molecular weight (Mw): 29,900
Molecular weight distribution (Mw/Mn): 1.91

This polymer compound is designated as Dopant Polymer 5.

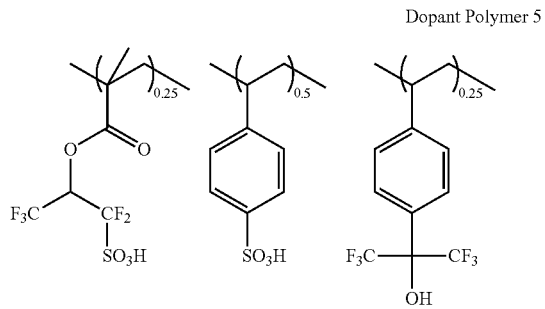

Dopant Polymer 5

Synthesis Example 6

Under the nitrogen atmosphere, into 37.5 g of methanol stirred at 64° C. was added gradually over 4 hours a solution in which 25.3 g of Monomer 5, 19.1 g of lithium styrenesulfonate, and 3.34 g of dimethyl 2,2'-azobis(iso-butyrate) had been dissolved in 112.5 g of methanol. The resulting mixture was further stirred at 64° C. for 4 hours. After this mixture was cooled to room temperature, the mixture was gradually added into 1,000 g of ethyl acetate with vigorous stirring. The formed solid substance was collected by filtration, and then, it was dried under vacuum at 50° C. for 15 hours to obtain 39.6 g of white polymer.

The obtained white polymer was dissolved into 414 g of methanol; and then, the ammonium and lithium salts thereof were converted into the sulfa group by using an ion-exchange resin. Measurements of $^{19}$F-NMR, $^1$H-NMR, and GPC of the polymer thus obtained gave the following analysis results.

Copolymer composition ratio (molar ratio): Monomer 5:styrenesulfonic acid=1:1
Weight-average molecular weight (Mw): 28,700
Molecular weight distribution (Mw/Mn): 1.58

This polymer compound is designated as Dopant Polymer 6.

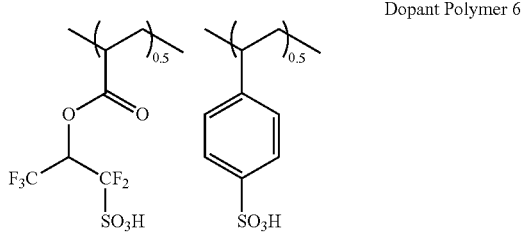

Dopant Polymer 6

Synthesis Example 7

Under the nitrogen atmosphere, into 37.5 g of methanol stirred at 64° C. was added gradually over 4 hours a solution in which 32.0 g of Monomer 6, 19.1 g of lithium styrenesulfonate, and 3.34 g of dimethyl 2,2'-azobis(iso-butyrate) had been dissolved in 112.5 g of methanol. The resulting mixture was further stirred at 64° C. for 4 hours. After this mixture was cooled to room temperature, the mixture was gradually added into 1,000 g of ethyl acetate with vigorous stirring. The formed solid substance was collected by filtration, and then, it was dried under vacuum at 50° C. for 15 hours to obtain 46.9 g of white polymer.

The obtained white polymer was dissolved into 414 g of methanol; and then, the ammonium and lithium salts thereof were converted into the sulfo group by using an ion-exchange resin. Measurements of $^{19}$F-NMR, $^{1}$H-NMR, and GPC of the polymer thus obtained gave the following analysis results.

Copolymer composition ratio (molar ratio): Monomer 6:styrenesulfonic acid=1:1

Weight-average molecular weight (Mw): 45,100

Molecular weight distribution (Mw/Mn): 1.93

This polymer compound is designated as Dopant Polymer 7.

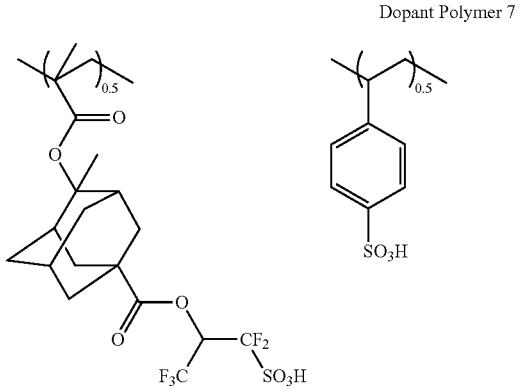

Dopant Polymer 7

Synthesis Example 8

Under the nitrogen atmosphere, into 37.5 g of methanol stirred at 64° C. was added gradually over 4 hours a solution in which 29.4 g of Monomer 7, 19.1 g of lithium styrenesulfonate, and 3.34 g of dimethyl 2,2'-azobis(iso-butyrate) had been dissolved in 112.5 g of methanol. The resulting mixture was further stirred at 64° C. for 4 hours. After this mixture was cooled to room temperature, the mixture was gradually added into 1,000 g of ethyl acetate with vigorous stirring. The formed solid substance was collected by filtration, and then, it was dried under vacuum at 50° C. for 15 hours to obtain 44.1 g of white polymer.

The obtained white polymer was dissolved into 414 g of methanol; and then, the ammonium and lithium salts thereof were converted into the sulfa group by using an ion-exchange resin. Measurements of $^{19}$F-NMR, $^{1}$H-NMR, and GPC of the polymer thus obtained gave the following analysis results.

Copolymer composition ratio (molar ratio): Monomer 7:styrenesulfonic acid=1:1

Weight-average molecular weight (Mw): 48,300

Molecular weight distribution (Mw/Mn): 1.98

This polymer compound is designated as Dopant Polymer 8.

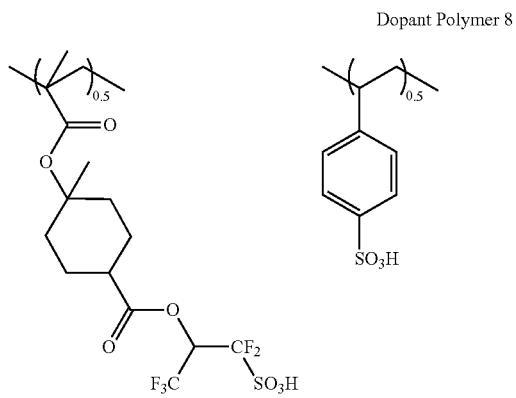

Dopant Polymer 8

Preparation of the Conductive Polymer Composite Dispersion Containing Polythiophene as the π-Conjugated Polymer

Preparation Example 1

A solution in which 15.0 g of Dopant Polymer 1 had been dissolved in 1,000 mL of ultrapure water was mixed with 3.82 g of 3,4-ethylenedioxythiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the solution and keeping the temperature thereof at 30° C.; and then, the reaction was carried out for 4 hours with stirring.

Into the reaction solution thus obtained was added 1,000 mL of ultrapure water; and then, about 1,000 mL of the solution was removed by using the ultrafiltration method. This procedure was repeated for 3 times.

Then, 200 mL of sulfuric acid diluted to 10% by mass and 2,000 mL of ion-exchanged water were added to the solution treated with the ultrafiltration, and then, about 2,000 mL of the treated solution was removed by using the ultrafiltration method; and then, after 2,000 mL of ion-exchanged water was added thereto, about 2,000 mL of the solution was removed again. This procedure was repeated for 3 times.

After this treated solution was purified by a cation exchange resin and an anion exchange resin, 2,000 mL of ion-exchanged water was further added thereto; and then, about 2,000 mL of the treated solution was removed by using the ultrafiltration method. This procedure was repeated for 5 times to obtain Conductive Polymer Composite Dispersion 1 having a blue color with the concentration of 1.3% by mass.

Conditions of the ultrafiltration were as following.
Cut-off molecular weight of the ultrafiltration membrane: 30 K
Cross-flow method
Flow rate of the supply solution: 3,000 mL/min
Partial membrane pressure: 0.12 Pa Meanwhile, in other Preparation Examples, the ultrafiltration was carried out with the same conditions as the above conditions.

Preparation Example 2

Procedure of Preparation Example 1 was repeated, except that Dopant Polymer 1 was changed to Dopant Polymer 2, the blending amount of 3,4-ethylenedioxy-thiophene was changed to 2.73 g, the blending amount of sodium persulfate was changed to 6.01 g, and the blending amount of ferric sulfate was changed to 1.64 g, to obtain Conductive Polymer Composite Dispersion 2.

Preparation Example 3

Procedure of Preparation Example 1 was repeated, except that Dopant Polymer 1 was changed to Dopant Polymer 3, the blending amount of 3,4-ethylenedioxy-thiophene was changed to 3.38 g, the blending amount of sodium persulfate was changed to 7.44 g, and the blending amount of ferric sulfate was changed to 2.03 g, to obtain Conductive Polymer Composite Dispersion 3.

Preparation Example 4

Procedure of Preparation Example 1 was repeated, except that Dopant Polymer 1 was changed to Dopant Polymer 4, the blending amount of 3,4-ethylenedioxy-thiophene was changed to 2.56 g, the blending amount of sodium persulfate was changed to 5.63 g, and the blending amount of ferric sulfate was changed to 1.53 g, to obtain Conductive Polymer Composite Dispersion 4.

Preparation Example 5

Procedure of Preparation Example 1 was repeated, except that Dopant Polymer 1 was changed to Dopant Polymer 5, the blending amount of 3,4-ethylenedioxy-thiophene was changed to 4.77 g, the blending amount of sodium persulfate was changed to 10.49 g, and the blending amount of ferric sulfate was changed to 2.86 g, to obtain Conductive Polymer Composite Dispersion 5.

Preparation Example 6

Procedure of Preparation Example 1 was repeated, except that Dopant Polymer 1 was changed to Dopant Polymer 6, the blending amount of 3,4-ethylenedioxy-thiophene was changed to 3.93 g, the blending amount of sodium persulfate was changed to 8.65 g, and the blending amount of ferric sulfate was changed to 2.36 g, to obtain Conductive Polymer Composite Dispersion 6.

Preparation Example 7

Procedure of Preparation Example 1 was repeated, except that Dopant Polymer 1 was changed to Dopant Polymer 7, the blending amount of 3,4-ethylenedioxy-thiophene was changed to 2.73 g, the blending amount of sodium persulfate was changed to 6.01 g, and the blending amount of ferric sulfate was changed to 1.64 g, to obtain Conductive Polymer Composite Dispersion 7.

Preparation Example 8

Procedure of Preparation Example 1 was repeated, except that Dopant Polymer 1 was changed to Dopant Polymer 8, the blending amount of 3,4-ethylenedioxy-thiophene was changed to 2.96 g, the blending amount of sodium persulfate was changed to 6.51 g, and the blending amount of ferric sulfate was changed to 1.78 g, to obtain Conductive Polymer Composite Dispersion 8.

Preparation of the Conductive Polymer Composite Containing Polyaniline as the π-Conjugated Polymer Preparation Example 9

A solution in which 53.4 g of Dopant Polymer 1 had been dissolved in 1,000 mL of ultrapure water was mixed with 27.3 g of 2-methoxyaniline at 25° C.

Into the resulting mixed solution was slowly added 45.8 g of ammonium persulfate dissolved in 200 mL of ultrapure water while stirring the solution and keeping the temperature thereof at 0° C. to carry out the reaction.

After the obtained reaction solution was concentrated, the concentrated solution was gradually added into 4,000 mL of acetone to obtain green powders. The obtained green powders were dispersed again in 1,000 mL of ultrapure water; and then, this dispersion was gradually added into 4,000 mL of acetone to purify and recrystallize the green powders. This procedure was repeated for 3 times; and then, after the obtained green powders were redispersed in 2,000 mL of ultrapure water, about 1,000 mL of water was removed by using the ultrafiltration method (the first ultrafiltration). Then, after ultrapure water was added thereto so that the amount thereof was 2,000 mL, about 1,000 mL of water was removed by the second ultrafiltration. This procedure was repeated for 10 times to obtain the conductive polymer composite dispersion. This dispersion was gradually added into 4,000 mL of acetone to obtain the purified green powders (Conductive Polymer Composite 9).

Preparation Example 10

Procedure of Preparation Example 9 was repeated, except that 74.7 g of Dopant Polymer 2 was used in place of Dopant Polymer 1, to obtain Conductive Polymer Composite 10.

Preparation Example 11

Procedure of Preparation Example 9 was repeated, except that 60.3 g of Dopant Polymer 3 was used in place of Dopant Polymer 1, to obtain Conductive Polymer Composite 11.

Preparation Example 12

Procedure of Preparation Example 9 was repeated, except that 79.8 g of Dopant Polymer 4 was used in place of Dopant Polymer 1, to obtain Conductive Polymer Composite 12.

Preparation Example 13

Procedure of Preparation Example 9 was repeated, except that 42.8 g of Dopant Polymer 5 was used in place of Dopant Polymer 1, to obtain Conductive Polymer Composite 13.

Preparation Example 14

Procedure of Preparation Example 9 was repeated, except that 51.9 g of Dopant Polymer 6 was used in place of Dopant Polymer 1, to obtain Conductive Polymer Composite 14.

Preparation Example 15

Procedure of Preparation Example 9 was repeated, except that 74.7 g of Dopant Polymer 7 was used in place of Dopant Polymer 1, to obtain Conductive Polymer Composite 15.

Preparation Example 16

Procedure of Preparation Example 9 was repeated, except that 68.9 g of Dopant Polymer 8 was used in place of Dopant Polymer 1, to obtain Conductive Polymer Composite 16.

Preparation of the Conductive Polymer Composite Dispersion Containing Polystyrene Sulfonic Acid as the Dopant Polymer

Comparative Preparation Example 1

A solution in which 83.3 g of an aqueous solution of polystyrene sulfonic acid (concentration of 18.0% by mass, manufactured by Aldrich Co., Ltd.) had been diluted in 250 mL of ion-exchanged water was mixed with 5.0 g of 3,4-ethylenedioxythiphene at 30° C. Procedure of Preparation Example 1 was repeated, except for the above procedure, to obtain Conductive Polymer Composite Dispersion 17 (PEDOT-PSS Dispersion) having a blue color with the concentration of 1.3% by mass.

Comparative Preparation Example 2

A solution in which 226 g of an aqueous solution of polystyrene sulfonic acid (concentration of 18.0% by mass, manufactured by Aldrich Co., Ltd.) had been diluted in 400 mL of ion-exchanged water was mixed with 27.3 g of 2-methoxyaniline at 0° C. Procedure of Preparation Example 9 was repeated, except for the above procedure, to obtain Conductive Polymer Composite 18.

Examples

After 20 g of each Conductive Polymer Composite Dispersions 1 to 8 with the concentration of 1.3% by mass obtained in respective Preparation Examples 1 to 8 was mixed with dimethyl sulfoxide and FS-31 (fluoroalkyl nonionic surfactant; manufactured by E. I. du Pont de Nemours and Company) with the concentration thereof being 5% by mass and 0.3% by mass, respectively, the resulting mixture was filtrated by using a reproduced cellulose filter having pore diameter of 0.45 μm (manufactured by Advantec MFS, Inc.) to prepare the conductive polymer composition; and the respective compositions were designated as Examples 1 to 8. On the other hand, each of Conductive Polymer Composites 9 to 16 (powders) obtained in respective Preparation Examples 9 to 16 was made to the dispersion thereof with the concentration of 2.8% by mass, and then, this dispersion was mixed with FS-31 (fluoroalkyl nonionic surfactant; manufactured by E. I. du Pont de Nemours and Company) with the concentration thereof being 0.3% by mass; and then, this resulting mixture was filtrated by using a reproduced cellulose filter having pore diameter of 0.45 μm (manufactured by Advantec MFS, Inc.) to prepare the conductive polymer composition; and the respective compositions were designated as Examples 9 to 16.

Comparative Examples

As to Conductive Polymer Composite Dispersion 17 obtained in Comparative Preparation Example 1, the procedure of Examples 1 to 8 was repeated, and as to Conductive Polymer Composite 18 obtained in Comparative Preparation Example 2, the procedure of Examples 9 to 16 was repeated, whereby the respective conductive polymer compositions were prepared; and these compositions were designated as Comparative Examples 1 and 2, respectively.

Each of the conductive polymer compositions of Examples and Comparative Examples which were prepared as mentioned above was evaluated by the methods as shown below.

(Filterability)

In the preparation of the conductive polymer compositions of Examples and Comparative Examples, during the time of filtration thereof by using the reproduced cellulose filter having pore diameter of 0.45 μm, if the composition could be filtrated through the filter, this is shown by P (namely, passed), and if the composition could not be filtrated through the filter due to clogging thereof, this is shown by NP (namely, not passed) in Table 1 and Table 2.

(Applicability)

Firstly, the conductive polymer composition was applied by spin coating onto a Si wafer by using 1H-360S SPIN-COATER (manufactured by MIKASA Co., Ltd.) such that the film thickness thereof might become 100±5 nm. Then, this was baked for 5 minutes in an accuracy incubator at 120° C. to remove the solvent, thereby the conductive film was obtained. The refractive index (n and k) to this conductive film at the wavelength of 636 nm was measured by VASE (manufactured by J. A. Woollam Co., Inc.), the spectroscopic ellipsometer with the type of variable incident angle. If the uniform film could be formed, this is shown by G (namely, good), and if a defect derived from particles or a partial striation was found in the film even if the measurement of the refractive index thereof could be carried out, this is shown by NG (namely, no good) in Table 1 and Table 2.

(Transmittance)

From the extinction coefficient (k-value) measured by using the spectroscopic ellipsometer with the type of variable incident angle (VASE), the transmittance of the light of the wavelength of 550 nm in FT=200 nm was calculated. These results are shown in Table 1 and Table 2.

(Conductivity)

Firstly, 10 mL of the conductive polymer composition was dropped onto a $SiO_2$ wafer having a diameter of 4 inches (100 mm); then, 10 seconds thereafter, the entirety of the wafer was spin-coated by using a spinner. The spin coating conditions were adjusted so as to give the film thickness of 100±5 nm. Then, this was baked for 5 minutes in an accuracy incubator at 120° C. to remove the solvent, thereby the conductive film was obtained.

The conductivity (S/cm) of the conductive film thereby obtained was obtained from the measured surface resistivity (Ω/□) and film thickness obtained by using Hiresta-UP MCP-HT450 and Loresta-GP MCP-T610 (both are manufactured by Mitsubishi Chemical corp.). These results are shown in Table 1 and Table 2.

(Surface Roughness)

Similarly to the evaluation method of the conductivity, the conductive film was obtained on the $SiO_2$ wafer having a diameter of 4 inches (100 mm). The Ra value (average roughness) was measured by using NX10 (manufactured by Park Systems Corp.). These results are shown in Table 1 and Table 2.

(Viscosity)

The solid concentrations of the conductive polymer compositions in Examples 1 to 8 and Comparative Example 1 were set 1.3% by weight, and the same of Examples 9 to 16 and Comparative Example 2 were set 2.8% by weight, respectively, and the solution temperature thereof were set at 25° C. The viscosity of the composition immediately after preparation was measured by taking 35 mL of the solution into a measurement cell exclusively dedicated to the tuning fork vibration viscometer SV-10 (manufactured by A&D Co., Ltd.). These results are shown in Table 1 and Table 2.
[Evaluation of the Conductive Polymer Composition Containing Polythiophene as the π-Conjugated Polymer]

TABLE 1

|  | Filterability | Applicability | Viscosity (mPa/S) | Surface roughness (Ra, nm) | Transmittance (FT = 200 nm, λ = 550 nm) | Conductivity (S/cm) |
| --- | --- | --- | --- | --- | --- | --- |
| Example 1 | P | G | 17.4 | 1.34 | 94% | $3.88 \times 10^2$ |
| Example 2 | P | G | 18.7 | 1.40 | 92% | $3.90 \times 10^2$ |
| Example 3 | P | G | 15.0 | 1.38 | 95% | $3.75 \times 10^2$ |
| Example 4 | P | G | 14.6 | 1.41 | 97% | $3.42 \times 10^2$ |
| Example 5 | P | G | 17.6 | 1.36 | 97% | $2.42 \times 10^2$ |
| Example 6 | P | G | 15.5 | 1.44 | 95% | $3.77 \times 10^2$ |
| Example 7 | P | G | 16.3 | 1.38 | 95% | $3.63 \times 10^2$ |
| Example 8 | P | G | 17.6 | 1.36 | 97% | $3.58 \times 10^2$ |
| Comparative Example 1 | NP | NG | 65.0 | 2.31 | 85% | $4.60 \times 10^2$ |

As shown in Table 1, Examples 1 to 8, all of which contained polythiophene as the π-conjugated polymer and the dopant polymer having the repeating unit "a", showed excellent filterability, and also could give a uniform coat film by a spin coater. In addition, the conductivities thereof were almost in the same level as that of Comparative Example 1; and also, the transmittances thereof in the visible light of λ=550 nm and surface roughness of the same were excellent. In addition, Examples 1 to B and Comparative Example 1, all of which contained polythiophene as the π-conjugated polymer, showed higher conductivities as compared with later-mentioned Examples 9 to 16 and Comparative Example 2, all of which contained polyaniline as the π-conjugated polymer.

On the other hand, Comparative Example 1 which used polystyrene sulfonic acid not having the repeating unit "a" as the dopant polymer had a limit in decrease of the viscosity even after repeated pulverization treatments, and in addition, the filterability thereof was poor; and as a result, the striation as well as fish-eyes derived from particles and foams by spin coating was formed on the coat film, and on top of this, a uniform and flat coat film could not be obtained. In addition, the transmittance thereof in the visible light of λ=550 nm and surface roughness of the same was poorer as compared with those of Examples 1 to 8, even though the conductivity thereof was higher enough.

[Evaluation of the Conductive Polymer Composition Containing Polyaniline as the π-Conjugated Polymer]

As shown in Table 2, Examples 9 to 16, all of which contained polyaniline as the π-conjugated polymer and the dopant polymer having the repeating unit "a", showed excellent filterability, and also could give a uniform coat film by a spin coater. In addition, the conductivities thereof were almost in the same level as that of Comparative Example 2, even though they were poorer as compared with the above-mentioned Examples 1 to 8, all of which contained polythiophene as the π-conjugated polymer. Also, the transmittances thereof in the visible light of λ=550 nm and surface roughness of the same were excellent.

On the other hand, in Comparative Example 2 which used polystyrene sulfonic acid not having the repeating unit "a" as the dopant polymer, not only filtration could be executed, but also film-formability was excellent; however, the transmittance thereof in the visible light of λ=550 nm and surface roughness of the same was poorer as compared with those of Examples 9 to 16.

As discussed above, it became apparent that the conductive polymer composite of the present invention has low viscosity; excellent filterability and superior film-formability by spin coating, and also can form a conductive film having excellent transparency, flatness, durability and conductivity when the film is formed with the composite.

It must be noted here that the present invention is not limited to the embodiments as described above. The foregoing embodiments are mere examples; and therefore, any form having substantially the same composition as the technical concept described in claims of the present invention and showing similar effects is included in the technical scope of the present invention.

What is claimed is:
1. A conductive polymer composite comprising:
(A) a π-conjugated polymer and
(B) a dopant polymer which contains a repeating unit "a" which is shown by the following general formula (1)

TABLE 2

|  | Filterability | Applicability | Viscosity (mPa/S) | Surface roughness (Ra, nm) | Transmittance (FT = 200 nm, λ = 550 nm) | Conductivity (S/cm) |
| --- | --- | --- | --- | --- | --- | --- |
| Example 9 | P | G | 2.0 | 0.61 | 88% | $1.20 \times 10^{-3}$ |
| Example 10 | P | G | 2.1 | 0.62 | 89% | $1.22 \times 10^{-3}$ |
| Example 11 | P | G | 2.0 | 0.55 | 91% | $1.10 \times 10^{-3}$ |
| Example 12 | P | G | 2.1 | 0.54 | 90% | $1.03 \times 10^{-4}$ |
| Example 13 | P | G | 2.2 | 0.54 | 90% | $1.49 \times 10^{-3}$ |
| Example 14 | P | G | 2.0 | 0.54 | 90% | $1.18 \times 10^{-3}$ |
| Example 15 | P | G | 2.5 | 0.54 | 90% | $1.25 \times 10^{-3}$ |
| Example 16 | P | G | 2.3 | 0.54 | 90% | $1.17 \times 10^{-3}$ |
| Comparative Example 2 | P | G | 2.0 | 0.75 | 84% | $5.00 \times 10^{-3}$ | having weight-average molecular weight thereof in the range of 1,000 to 500,000,

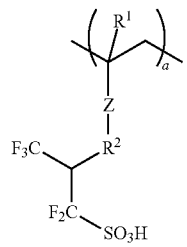
(1)

wherein, $R^1$ represents a hydrogen atom or a methyl group; $R^2$ represents a single bond, an ester group, or a linear, branched, or cyclic hydrocarbon group having 1 to 12 carbon atoms which may optionally contain any one of an ether group and an ester group or both; Z represents a phenylene group, a naphthylene group, or an ester group; and "a" represents a relative fractional amount of its corresponding repeating unit and is in the range of $0 < a \leq 1.0$.

2. The conductive polymer composite according to claim 1, wherein the repeating unit "a" in the component (B) contains one or more repeating units selected from "a1" to "a6" which are shown by the following general formulae (1-1) to (1-6),

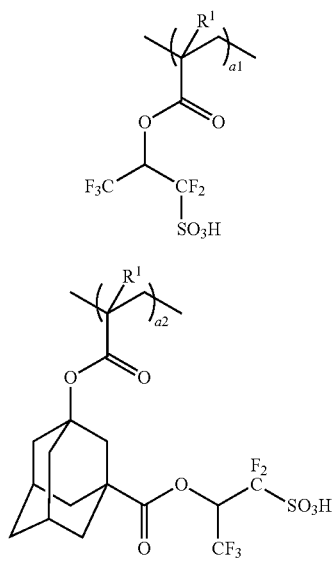
(1-1)

(1-2)

(1-3)

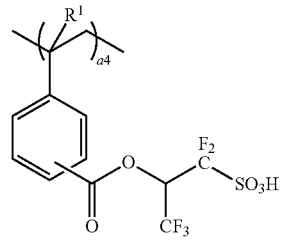
(1-4)

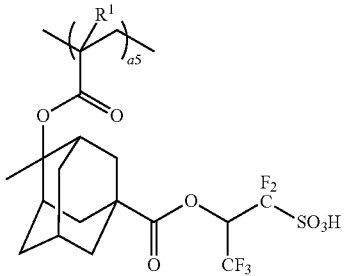
(1-5)

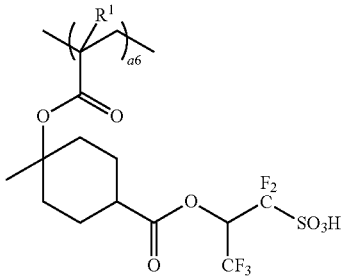
(1-6)

wherein, $R^1$ represents the same meaning as before; and "a1", "a2", "a3", "a4", "a5", and "a6" each represent a relative fractional amount of their corresponding repeating units and are in the range of $0 \leq a1 \leq 1.0$, $0 \leq a2 \leq 1.0$, $0 \leq a3 \leq 1.0$, $0 \leq a4 \leq 1.0$, $0 \leq a5 \leq 1.0$, $0 \leq a6 \leq 1.0$, and $0 < a1+a2+a3+a4+a5+a6 \leq 1.0$.

3. The conductive polymer composite according to claim 1, wherein the component (B) further contains a repeating unit "b" which is shown by the following general formula (2),

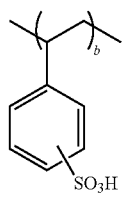
(2)

wherein, "b" represents a relative fractional amount of its corresponding repeating unit and is in the range of $0 < b < 1.0$.

4. The conductive polymer composite according to claim 2, wherein the component (B) further contains a repeating unit "b" which is shown by the following general formula (2),

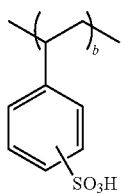
(2)

wherein, "b" represents a relative fractional amount of its corresponding repeating unit and is in the range of 0<b<1.0.

5. The conductive polymer composite according to claim 1, wherein the component (B) is a block copolymer.

6. The conductive polymer composite according to claim 2, wherein the component (B) is a block copolymer.

7. The conductive polymer composite according to claim 3, wherein the component (B) is a block copolymer.

8. The conductive polymer composite according to claim 4, wherein the component (B) is a block copolymer.

9. The conductive polymer composite according to claim 1, wherein the component (A) is a polymer formed by polymerization of one or more precursor monomers selected from the group consisting of pyrrole, thiophene, selenophene, tellurophene, aniline, a polycyclic aromatic compound, and a derivative thereof.

10. The conductive polymer composite according to claim 2, wherein the component (A) is a polymer formed by polymerization of one or more precursor monomers selected from the group consisting of pyrrole, thiophene, selenophene, tellurophene, aniline, a polycyclic aromatic compound, and a derivative thereof.

11. The conductive polymer composite according to claim 3, wherein the component (A) is a polymer formed by polymerization of one or more precursor monomers selected from the group consisting of pyrrole, thiophene, selenophene, tellurophene, aniline, a polycyclic aromatic compound, and a derivative thereof.

12. The conductive polymer composite according to claim 4, wherein the component (A) is a polymer formed by polymerization of one or more precursor monomers selected from the group consisting of pyrrole, thiophene, selenophene, tellurophene, aniline, a polycyclic aromatic compound, and a derivative thereof.

13. The conductive polymer composite according to claim 5, wherein the component (A) is a polymer formed by polymerization of one or more precursor monomers selected from the group consisting of pyrrole, thiophene, selenophene, tellurophene, aniline, a polycyclic aromatic compound, and a derivative thereof.

14. The conductive polymer composite according to claim 1, wherein the conductive polymer composite has dispersibility in water or in an organic solvent.

15. A substrate having a conductive film formed thereon with the conductive polymer composite according to claim 1.

16. A substrate having a conductive film formed thereon with the conductive polymer composite according to claim 2.

17. A substrate having a conductive film formed thereon with the conductive polymer composite according to claim 3.

18. A substrate having a conductive film formed thereon with the conductive polymer composite according to claim 4.

19. A substrate having a conductive film formed thereon with the conductive polymer composite according to claim 5.

20. The substrate according to claim 15, wherein the conductive film functions as a transparent electrode layer.

* * * * *